(12) United States Patent
Lin

(10) Patent No.: US 8,349,546 B2
(45) Date of Patent: Jan. 8, 2013

(54) FABRICATING METHOD OF NANO-RING STRUCTURE BY NANO-LITHOGRAPHY

(76) Inventor: Ming-Nung Lin, Pingtung (TW)

( * ) Notice: Subject to any disclaimer, the term of this patent is extended or adjusted under 35 U.S.C. 154(b) by 1054 days.

(21) Appl. No.: 12/213,816

(22) Filed: Jun. 25, 2008

(65) Prior Publication Data

US 2009/0004602 A1 Jan. 1, 2009

Related U.S. Application Data

(60) Provisional application No. 60/929,460, filed on Jun. 28, 2007.

(51) Int. Cl.
*H01L 21/441* (2006.01)
(52) U.S. Cl. .......................... 430/320; 977/774; 977/773
(58) Field of Classification Search .................. 430/320; 977/773, 774
See application file for complete search history.

(56) References Cited

U.S. PATENT DOCUMENTS

| 6,863,943 | B2 | 3/2005 | Wang et al. ..................... 428/37 |
| 6,906,369 | B2 | 6/2005 | Ross et al. ..................... 259/295 |
| 7,002,839 | B2 | 2/2006 | Kawabata et al. ............. 365/171 |
| 2007/0161238 | A1 * | 7/2007 | Lin ................................ 438/674 |
| 2008/0098805 | A1 * | 5/2008 | Jin et al. .......................... 73/105 |

* cited by examiner

*Primary Examiner* — Daborah Chacko Davis
(74) *Attorney, Agent, or Firm* — Bacon & Thomas, PLLC

(57) ABSTRACT

The present invention is to provide a "fabricating method of nano-ring structure by nano-lithography" for fabricating out a new nano-ring structure in more miniature manner than that of the current fabricating facilities by directly using the current fabricating facilities without any alteration or redesign of the precision so that the number and density of the nano-ring structure in unit area or unit volume can be significantly increased in more evenness manner.

10 Claims, 31 Drawing Sheets

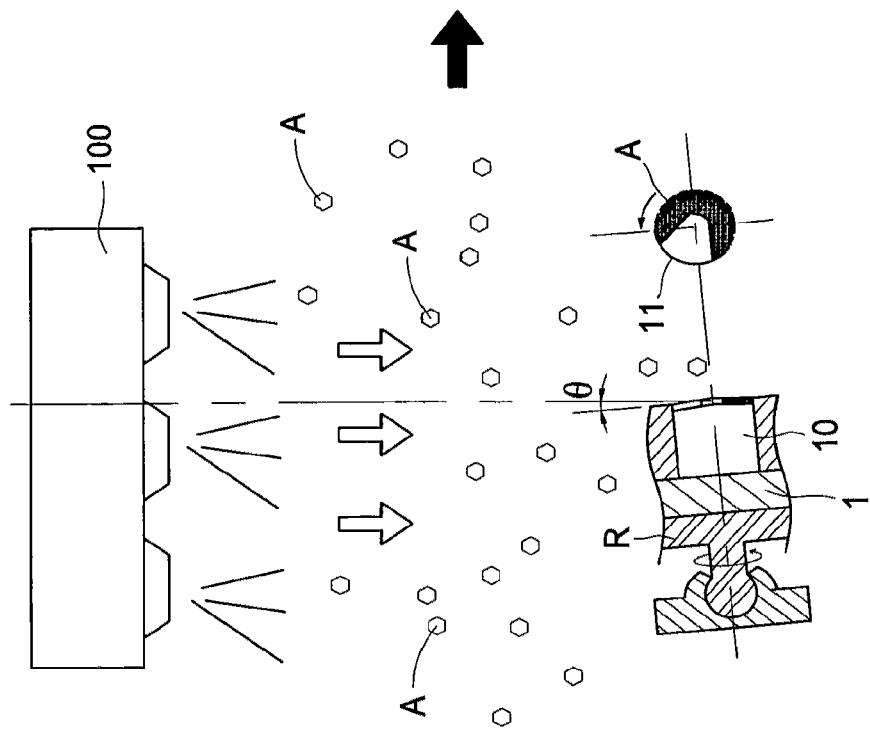
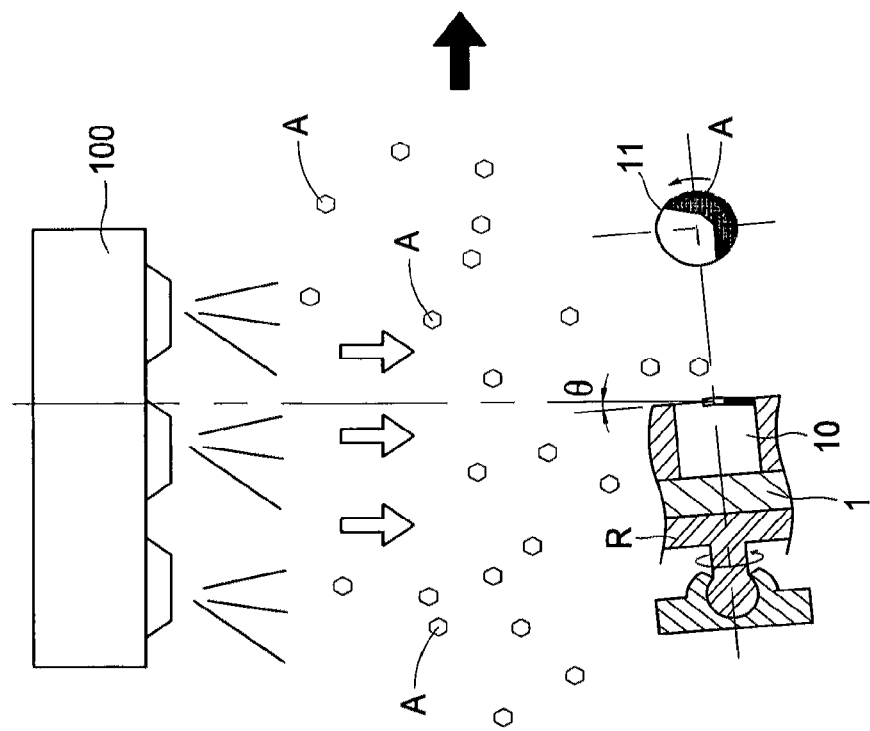

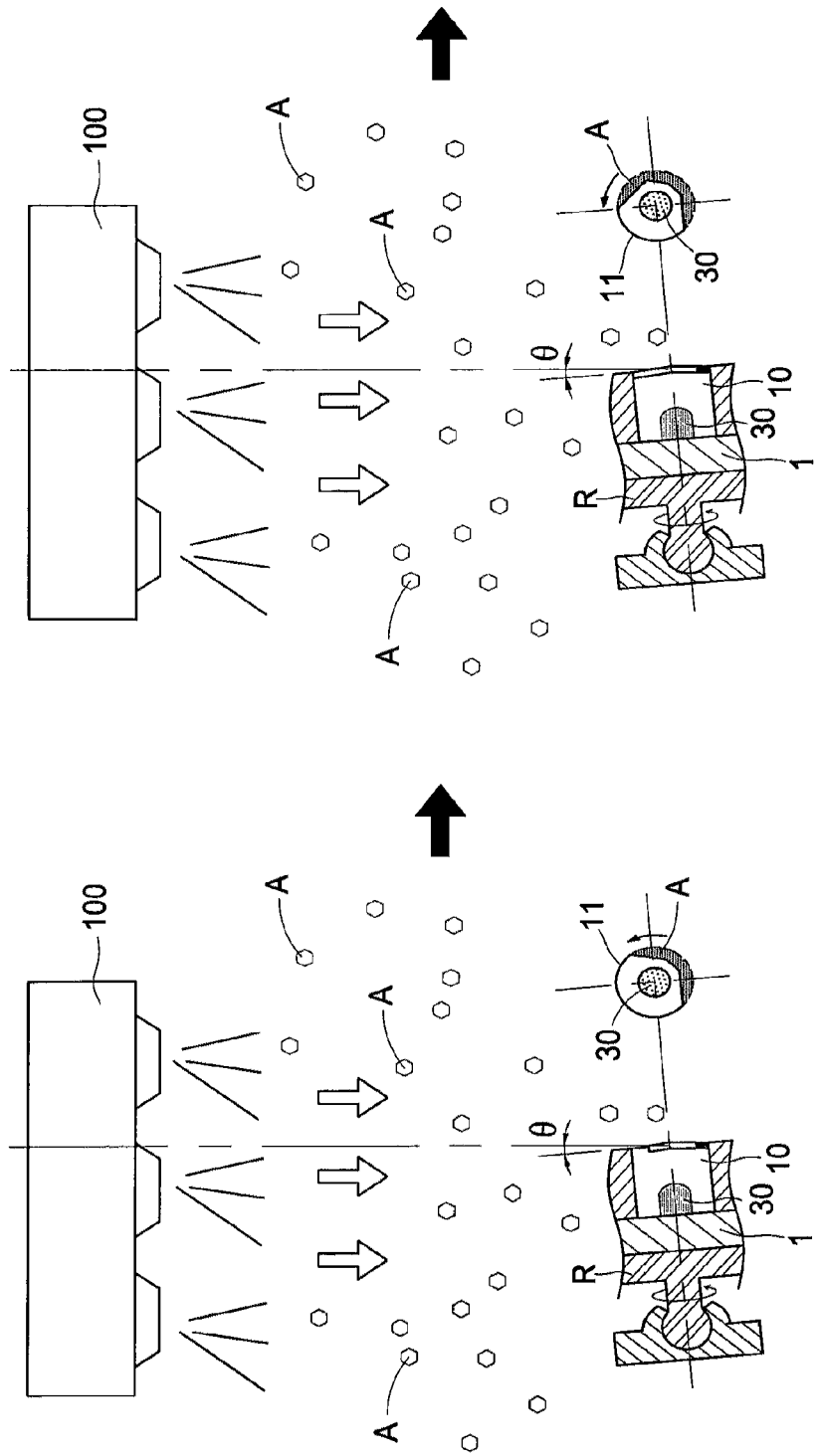

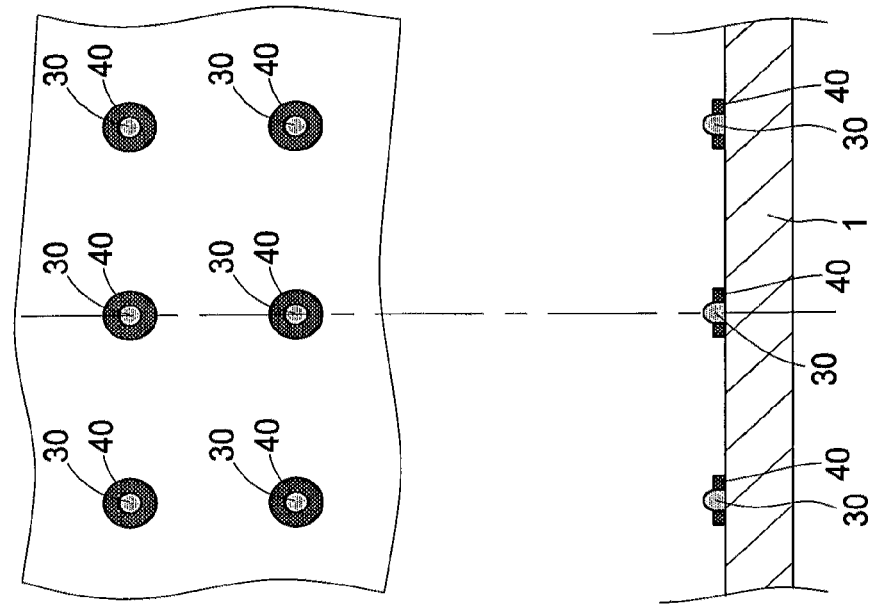
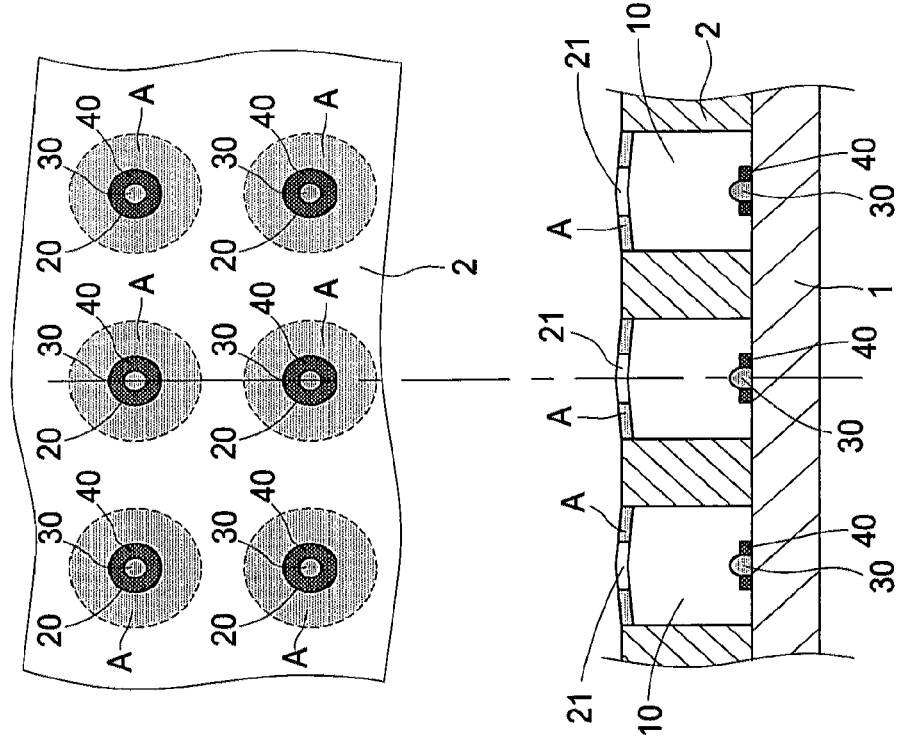

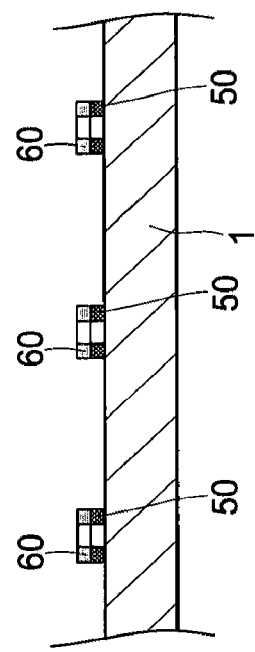
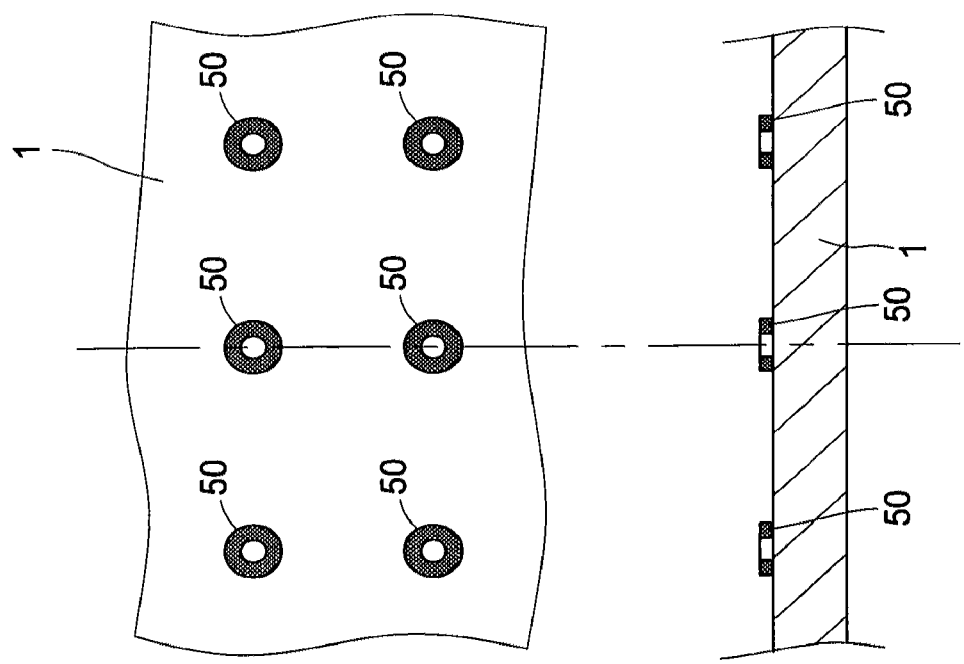
Fig.17
Fig.18

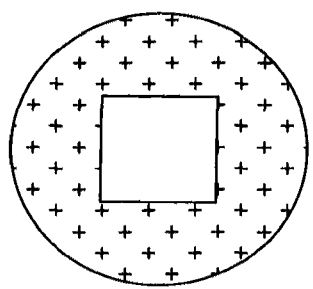 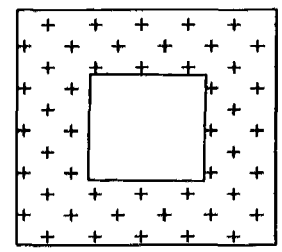
*Fig.22a*      *Fig.22b*
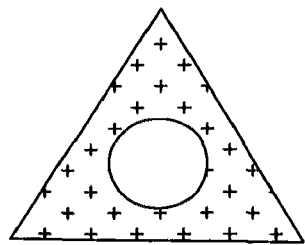 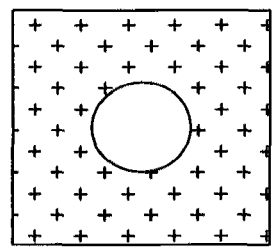
*Fig.23a*      *Fig.23b*
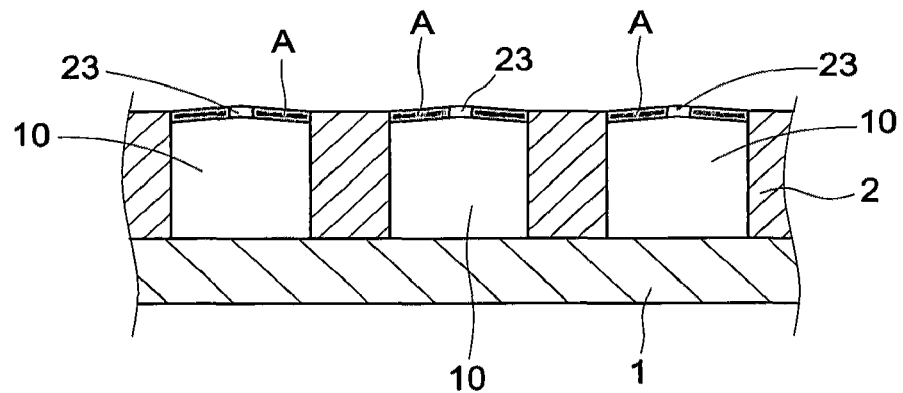
*Fig.24*

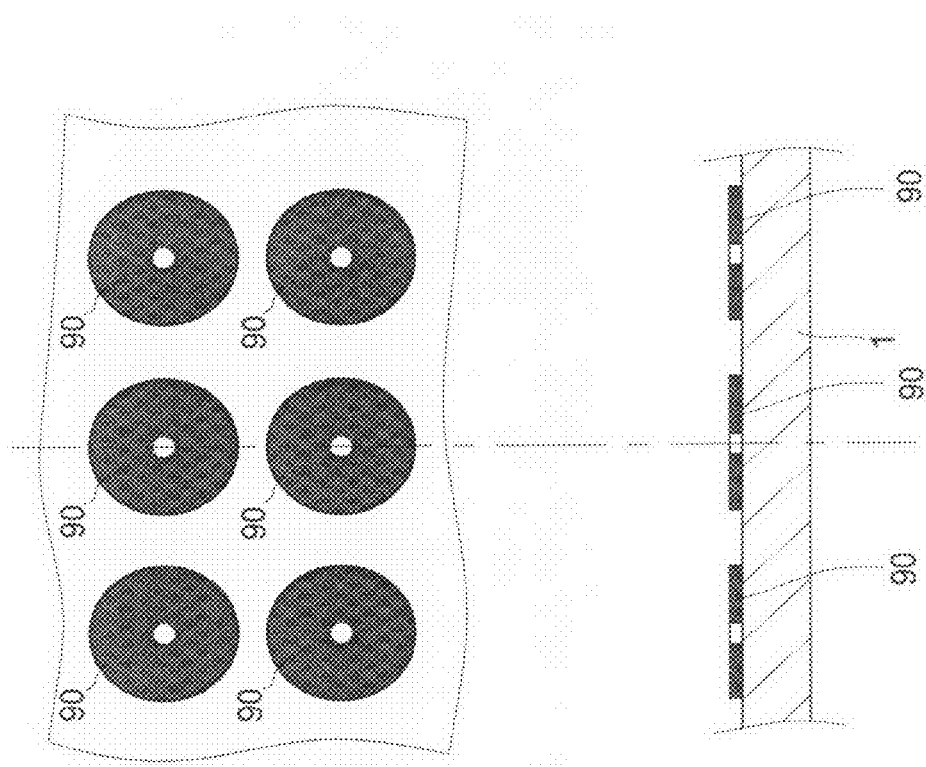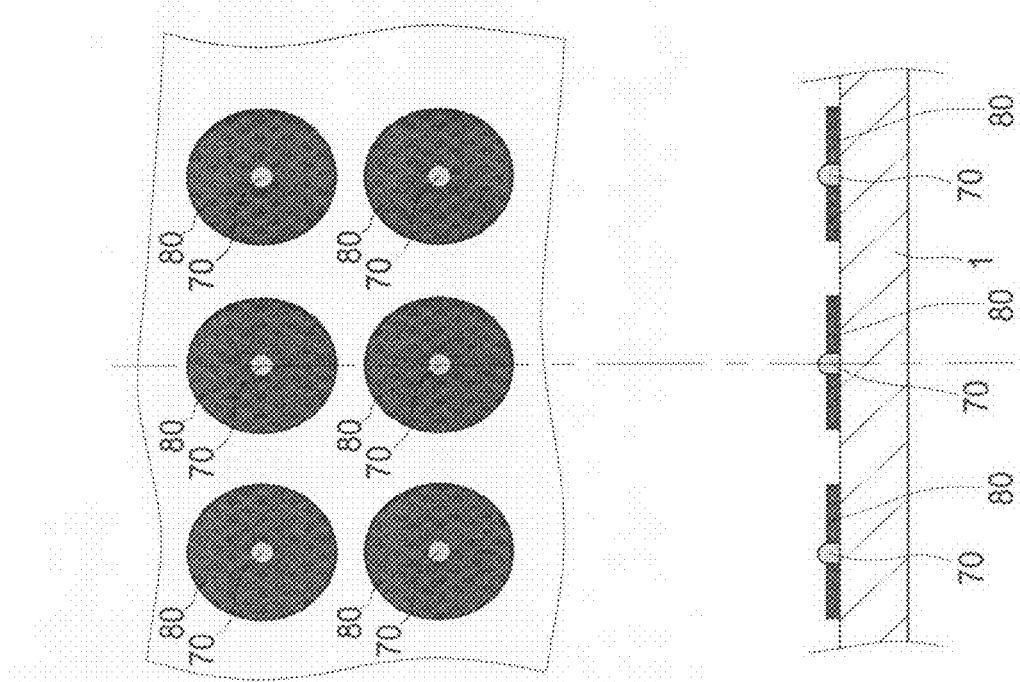

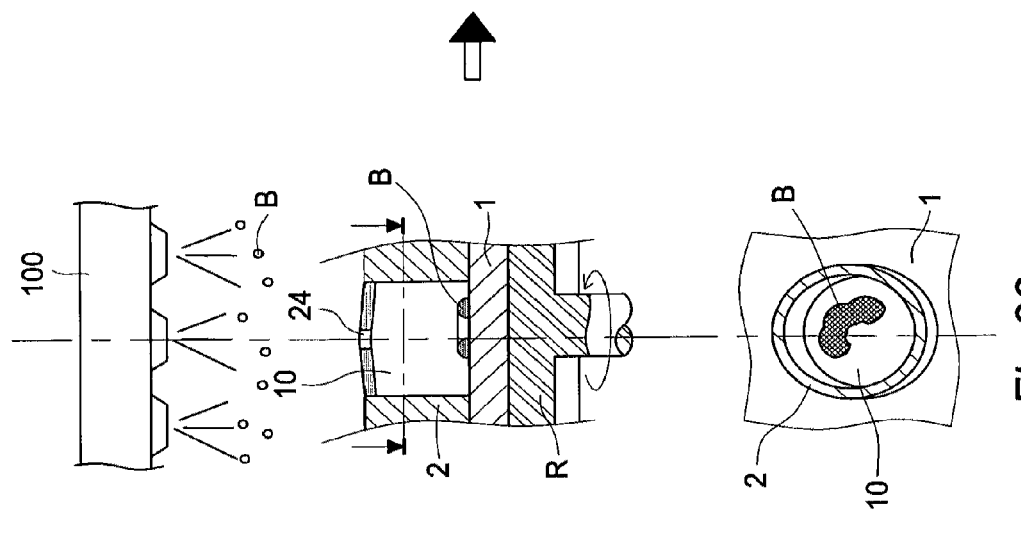
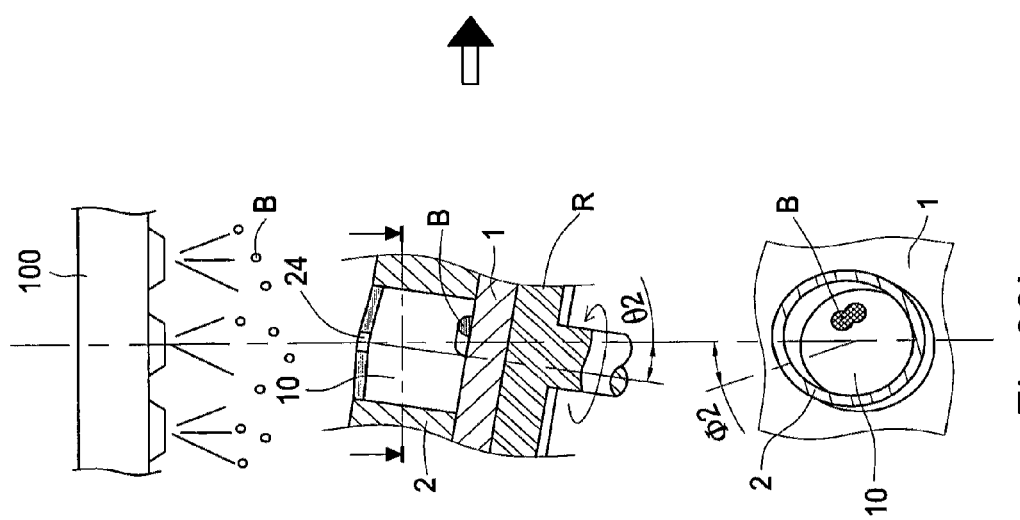
Fig. 33b
Fig. 33c

US 8,349,546 B2

FABRICATING METHOD OF NANO-RING STRUCTURE BY NANO-LITHOGRAPHY

This application claims the benefit of provisional U.S. Patent Application No. 60/929,460, field Jun. 28, 2007.

FIELD OF THE PRESENT INVENTION

The present invention relates to nano-ring structure of nano scale, particularly to the fabricating method thereof by directly using the current fabricating facilities so that the number and density of the nano-ring structure in unit area or unit volume can be significantly increased in more evenness manner.

BACKGROUND OF THE INVENTION

The development of the nano-science nowadays has been extensively applied in a variety of fields, especially in the semiconductor industry, which constantly produces many nano-devices and nano-components, wherein, the nano-ring structure is always used in semiconductor memory (DRAM or SRAM) or hard disk. The number and density of the nano-ring structure in unit area or unit volume will directly affect the memory capacity, quality or performance. Accordingly, the fabricating methods of nano-ring structure, which are disclosed recently such as USA patents in U.S. Pat. No. 6,863,943, U.S. Pat. No. 6,906,369, U.S. Pat. No. 7,002,839 and the like, all address and effort on the issue of number and density of the nano-ring structure in unit area or unit volume though minor differences exist among each other.

As shown in FIGS. 1 through 3c, the nano-structure is produced from conventional nano-lithography. The fabricating steps are as below: (A): Firstly, layout the expected nano pattern Q on a photomask M, then put said photomask M on the top surface of a substrate 1, which is spread with photo-resist 2 (as shown in the FIG. 1); (B): Secondly, pass light beam e through said nano pattern Q on said photomask M so as to have same pattern as said nano pattern Q on said photo-resist 2, which spreads on said substrate 1, by exposure and development to define a nano-aperture 3 structure (as shown in the FIG. 2); (C): Thirdly, by means of a deposit source device 100, directly a deposit material B of gas molecule or atom state on the surroundings and bottom of said nano-aperture 3 (as shown in the FIGS. 3a and 3b); and (D): Finally, selectively remove said photo-resist 2 by solution, thereby forming a nano quantum dot 4 structure on the surface of said substrate 1 (as shown in the FIG. 3c).

The conventional process aforesaid is confined to the precision limit of the existing photolithography such that the current best precise nano-scale can only reach 60~65 nm; Hence, the nano-scale of said nano-aperture 3 from photo-mask M of pattern transferring photolithography is over 60 nm; Thereby, the nano-scale of said nano quantum dot 4 fabricated from these equipment is also over 60 nm relatively; Thus, the physical size limit of said conventional nano-devices of nano-structure are still in the range of over 60 nm; Therefore, how to breakthrough this bottleneck such that making the nano-scale of nano-aperture 3 be smaller becomes the impending crucial technical tough question of all experts in various fields; The solution being subject to the industrial practical feasibility in mass production and cost-effective economical principle so that the choice of means in technical breakthrough becomes more difficult; The scientists who understand the nano-science and the experts who familiarize with nano-technology are all aware of the benefits of working out the nano-ring structure being smaller than 50 nm or even 1~2 nm, but none of better solution or effective technical breakthrough is proposed, announced or applied.

SUMMARY OF THE INVENTION

The primary object of the present invention is to fabricate out a new nano-ring structure in more miniature manner than that of the current fabricating facilities by directly using the current fabricating facilities without any alteration or redesign of the precision so that the number and density of the nano-ring structure in unit area or unit volume can be significantly increased in more evenness manner.

Another object of the present invention is to provide a "fabricating method of nano-ring structure by nano-lithography", which comprises the process steps as below: (a): Firstly, deposit sealant of gas molecule or atom state on top-opening of a nano cylindrical pore, which having formed on a preset photo-resist of substrate so that the diameter of said top-opening gradually reduce to become a first reduced nano-aperture, whose opening diameter is smaller than that of said top-opening; (b): Secondly, directly pass a first deposit material of gas molecule or atom state through said first reduced nano-aperture so that a core nano quantum dot of nano-ring structure with diameter being less than 60 nm is directly formed on the surface of said substrate, which being laid beneath the bottom of said nano cylindrical pore; (c): Thirdly, remove the sealant, which is deposited on the top opening of the first reduced nano-aperture to recover the diameter of the top-opening on said nano cylindrical pore; (d): Fourthly, re-deposit the sealant of gas molecule or atom state on the top-opening of the nano cylindrical pore so that the diameter of said top-opening gradually reduce to become a second reduced nano-aperture, whose opening diameter is smaller than that of said top-opening but larger than that of the first reduced nano-aperture; (e): Fifthly, directly pass a second deposit material of gas molecule or atom state through said second reduced nano-aperture so that a ambit nano quantum dot of nano-ring structure with diameter being less than 60 nm is directly formed on the surface of said substrate, which being laid beneath the bottom of said nano cylindrical pore; (f): Sixthly, by means of solution rinsing (i.e. wet etching) or gas etching (i.e. dry etching), remove both of the nano cylindrical pore and the photo-resist on the substrate; and (g): Finally, by means of etching method, selectively remove the first deposit material in the range of core nano quantum dot so that a nano-ring structure is directly formed on the substrate by existing second deposit material between the outer circumference of the core nano quantum dot and the inner circumference of the ambit nano quantum dot.

The further object of the present invention is to provide a "fabricating method of nano-ring structure by nano-lithography", which comprises the process steps as below: (a): Firstly, deposit the sealant of gas molecule or atom state on top-opening of a nano cylindrical pore, which having formed on a preset photo-resist of substrate so that the diameter of said top-opening gradually reduce to become a first reduced nano-aperture, whose opening diameter is smaller than that of said top-opening; (b): Secondly, directly pass a first deposit material of gas molecule or atom state through said first reduced nano-aperture so that a core nano quantum dot of nano-ring structure with diameter being less than 40 nm is directly formed on the surface of said substrate, which being laid beneath the bottom of said nano cylindrical pore; (c): Thirdly, remove the sealant, which is deposited on the top opening of the first reduced nano-aperture to recover the diameter of the top-opening on said nano cylindrical pore; (d): Fourthly, by means of etching method, expand the nano cylindrical pore for the recovered top-opening such that the diameter of the expanded nano cylindrical pore becomes larger than that of the top-opening on the original nano cylindrical pore; (e): Fifthly, perpendicularly pass a second deposit material of gas molecule or atom state through said expanded nano cylindrical pore so that a ambit nano quantum dot, which encloses the core nano quantum dot, having diameter being same as that of the expanded nano cylindrical pore is directly formed on the surface of said substrate, which being laid beneath the bottom of said nano cylindrical pore; (f): Sixthly, by means of solution rinsing (i.e. wet etching) or gas etching (i.e. dry etching), remove both of the expanded nano cylindrical pore and the photo-resist on the substrate; and (g): Finally, by means of etching method, selectively remove the first deposit material in the range of core nano quantum dot so that a nano-ring structure is directly formed on the substrate by existing second deposit material between the outer circumference of the core nano quantum dot and the inner circumference of the ambit nano quantum dot.

The other object of the present invention is to provide a "fabricating method of nano-ring structure by nano-lithography", which comprises the process steps as below: (a): Firstly, deposit a sealant of gas molecule or atom state on top-opening of a nano cylindrical pore, which having formed on a preset photo-resist of substrate so that the diameter of said top-opening gradually reduce to become a reduced nano-aperture, whose opening diameter is smaller than that of said top-opening; and (b): Secondly, firmly place said substrate on a tilt-rotary console having capability of 3-D tilt with rotation and one-by-one orderly adjust said tilt-rotary console in rotation angles $\Phi 1, \Phi 2, \Phi 3, \Phi 4$ together with forwards and backwards tilt angles as well as leftwards and rightwards yaw angles $\theta 1, \theta 2, \theta 3, \theta 4$ so that a deposit material of gas molecule or atom state can orderly pass the reduced nano-aperture to one-by-one continuously form a nano-ring structure on the surface of the substrate with diameter less than that of the nano cylindrical pore.

BRIEF DESCRIPTION OF THE DRAWINGS

FIG. 6c is the third step in flow chart showing the implementing process of first reduced nano-aperture on the top of nano cylindrical pore for the present invention.

FIG. 6d is the fourth step in flow chart showing the implementing process of first reduced nano-aperture on the top of nano cylindrical pore for the present invention.

FIG. 11c is the third step in flow chart showing the implementing process of second reduced nano-aperture on the top of nano cylindrical pore for the present invention.

FIG. 11d is the fourth step in flow chart showing the implementing process of second reduced nano-aperture on the top of nano cylindrical pore for the present invention.

FIG. 15 is the schematic view showing the implementing completion of ambit nano quantum dot on the surface of substrate via second reduced nano-aperture for the present invention.

FIG. 16 is the cross section schematic view showing the completion of core nano quantum dot and ambit nano quantum dot on the surface of substrate with photoresist having been removed for the FIG. 15.

FIG. 17 is the schematic view showing the completion of nano ring structure on the surface of substrate for the present invention.

FIG. 18 is the schematic view showing the completion of laminated nano ring structure of multi-layers on the surface of substrate for the present invention.

FIG. 22a is the schematic view showing the first combination of square first reduced nano-aperture and round second reduced nano-aperture on the top of nano cylindrical pore for the process steps of view-a through view-d in the FIG. 21.

FIG. 22b is the schematic view showing the second combination of square first reduced nano-aperture and square second reduced nano-aperture on the top of nano cylindrical pore for the process steps of view-a through view-d in the FIG. 21.

FIG. 23a is the schematic view showing the first combination of round first reduced nano-aperture and triangular second reduced nano-aperture on the top of nano cylindrical pore for the present invention.

FIG. 23b is the schematic view showing the second combination of round first reduced nano-aperture and square second reduced nano-aperture on the top of nano cylindrical pore for the present invention.

FIG. 24 is the cross section view showing the implementing completion of reduced nano-aperture on the top of nano cylindrical pore for the second exemplary embodiment of present invention.

FIG. 30 is the cross section schematic view showing the expanded nano cylindrical pore having been removed from the substrate for the second exemplary embodiment of present invention.

FIG. 31 is the schematic view showing the forming completion of nano ring structure on the substrate for the second exemplary embodiment of present invention.

FIG. 33b is the second step in operation schematic view showing the implementing process of nano ring structure on the bottom surface of nano cylindrical pore via reduced nano-aperture for the third exemplary embodiment of present invention.

FIG. 33c is the third step in operation schematic view showing the implementing process of nano ring structure on the bottom surface of nano cylindrical pore via reduced nano-aperture for the third exemplary embodiment of present invention.

DETAILED DESCRIPTION OF THE PREFERRED EMBODIMENTS

Figure 1:
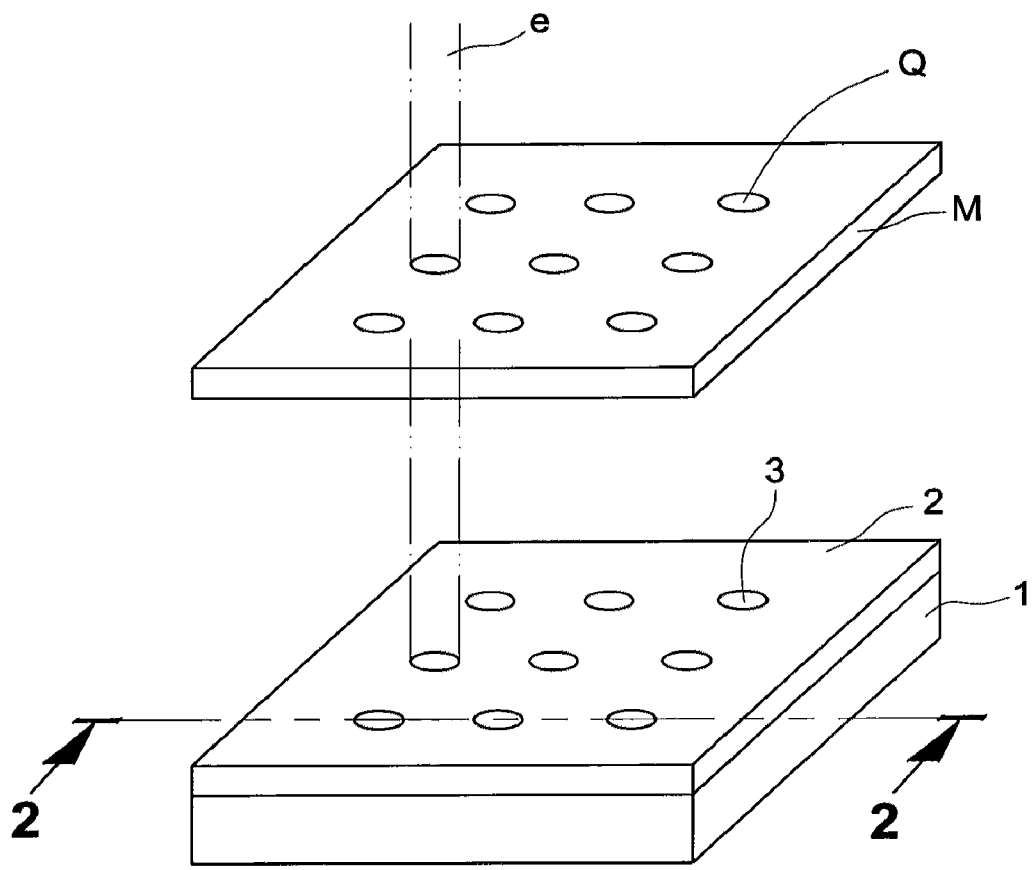
FIG. 1 is the perspective schematic view showing the photomask and substrate according to conventional nano pattern imprinting in photolithography of nano-technological process.
Figure 2:
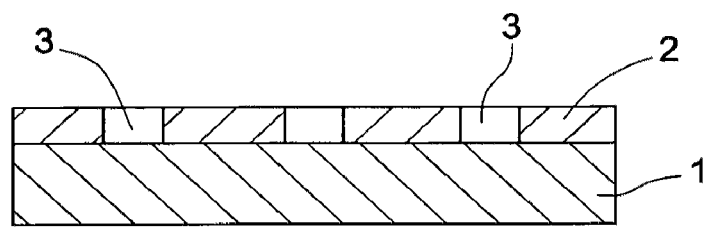
FIG. 2 is the cross section view taken along the section line 2-2 of the FIG. 1.
Figures 3A, 3B, 3C:
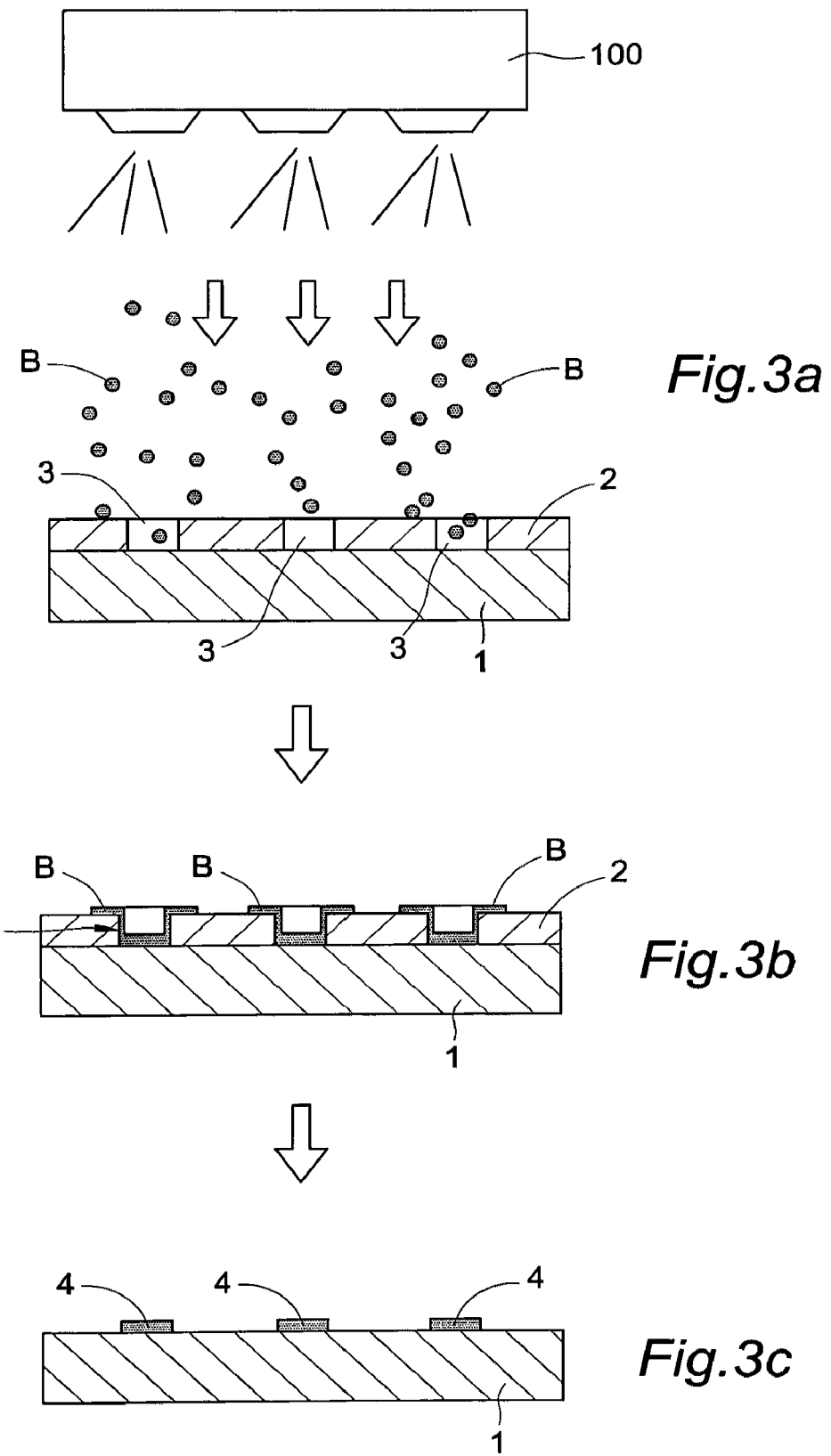
FIG. 3a is the first step in flow chart showing the fabrication of nano-quantum-dot structure according to conventional nano-technology.
FIG. 3b is the second step in flow chart showing the fabrication of nano-quantum-dot structure according to conventional nano-technology.
FIG. 3c is the third step in flow chart showing the fabrication of nano-quantum-dot structure according to conventional nano-technology.
Figure 4:
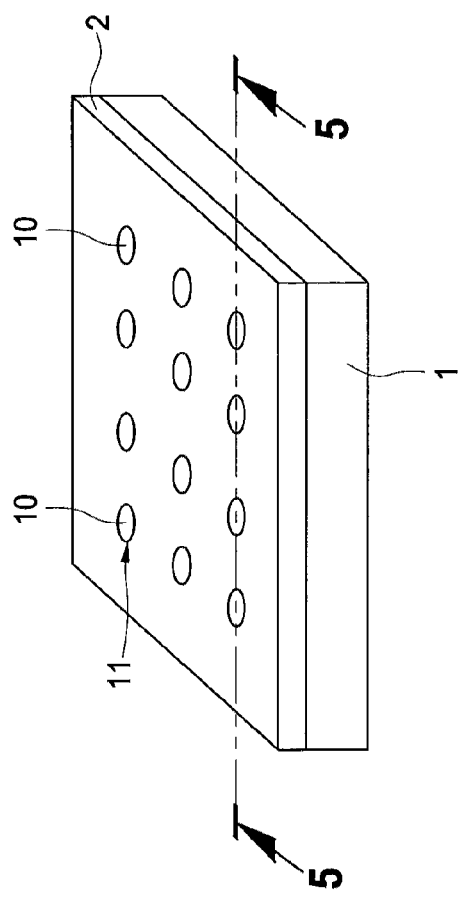
FIG. 4 is the perspective schematic view showing the formation of nano-cylindrical-pore according to build-up method or build-down method of conventional nano-technological process.
Figure 5:
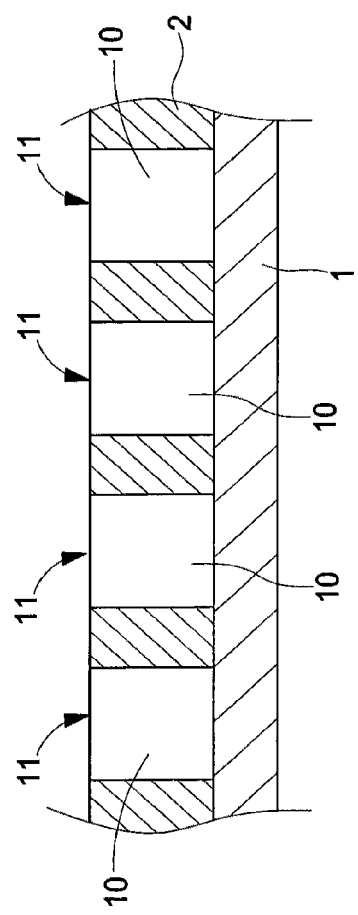
FIG. 5 is the cross section view taken along the section line 5-5 of the FIG. 4.
Figure 6A:
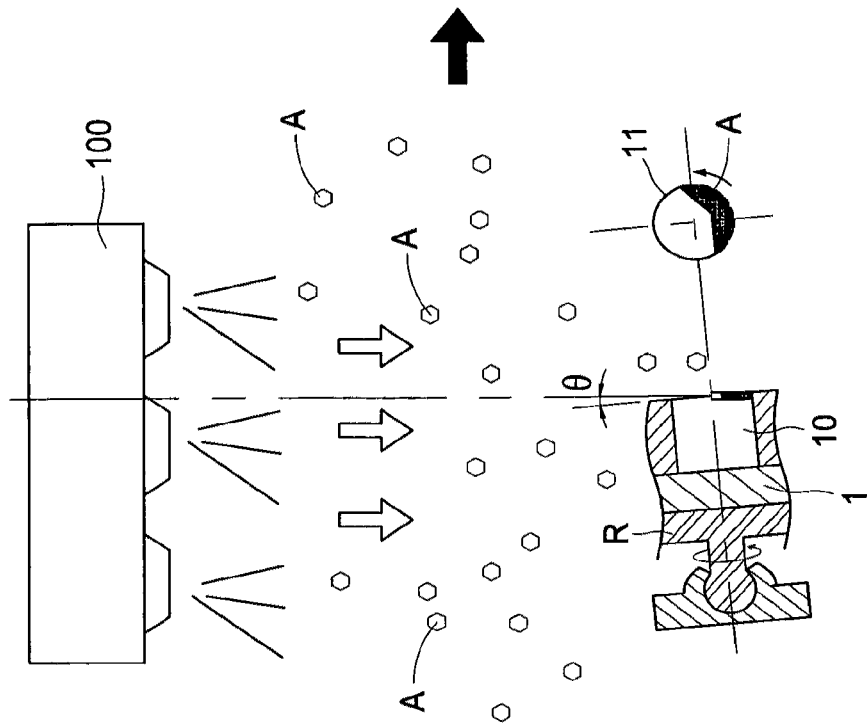
FIG. 6a is the first step in flow chart showing the implementing process of first reduced nano-aperture on the top of nano cylindrical pore for the present invention.
Figure 6B:
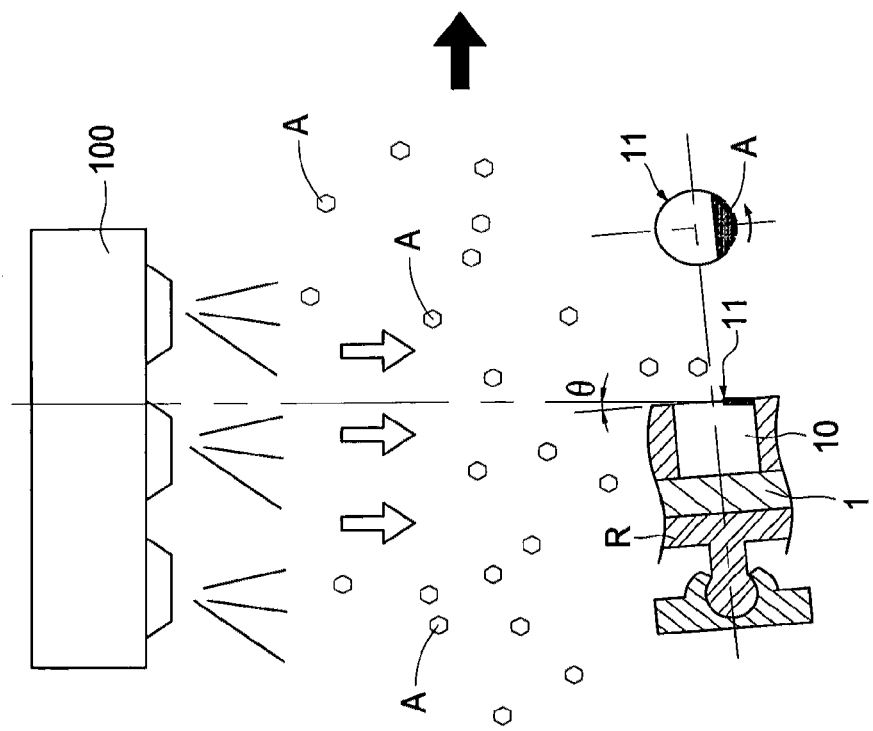
FIG. 6b is the second step in flow chart showing the implementing process of first reduced nano-aperture on the top of nano cylindrical pore for the present invention.
Figure 6F:
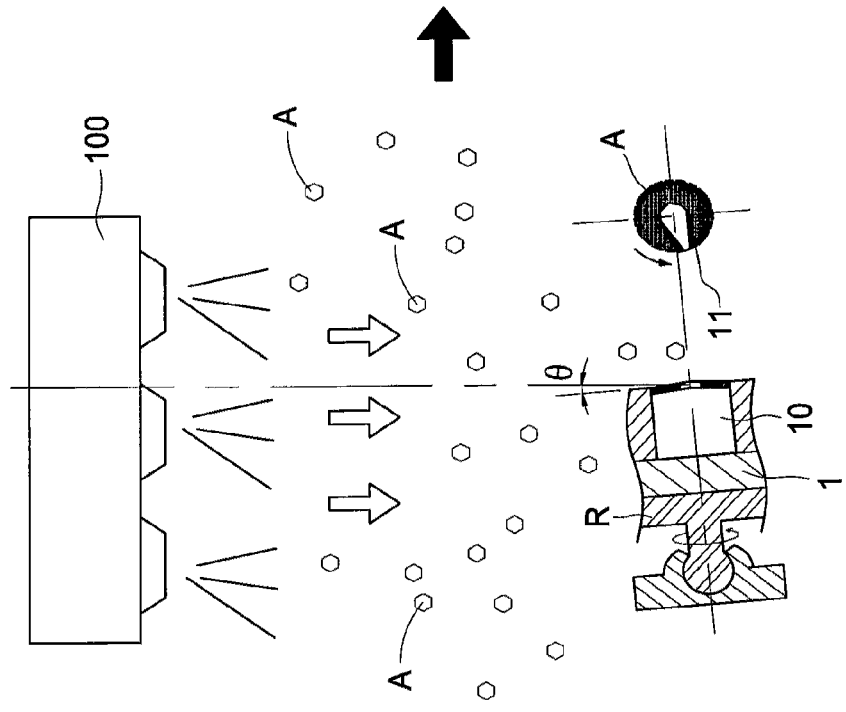
FIG. 6f is the sixth step in flow chart showing the implementing process of first reduced nano-aperture on the top of nano cylindrical pore for the present invention.
Figure 6E:
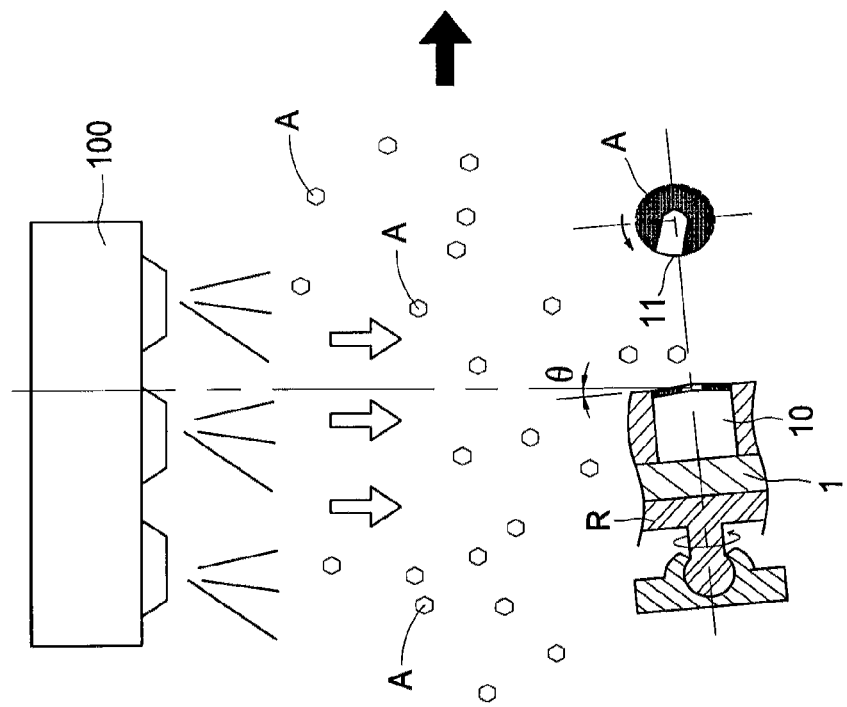
FIG. 6e is the fifth step in flow chart showing the implementing process of first reduced nano-aperture on the top of nano cylindrical pore for the present invention.
Figure 7:
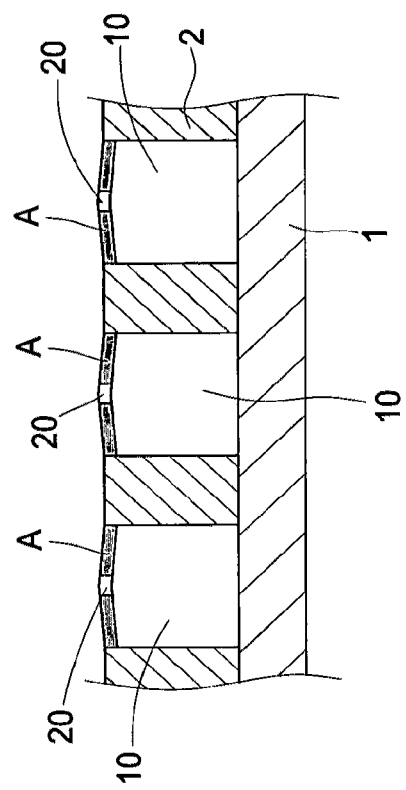
FIG. 7 is the cross section view showing the implementing completion of first reduced nano-aperture on the top of nano cylindrical pore for the present invention.
Figure 6G:
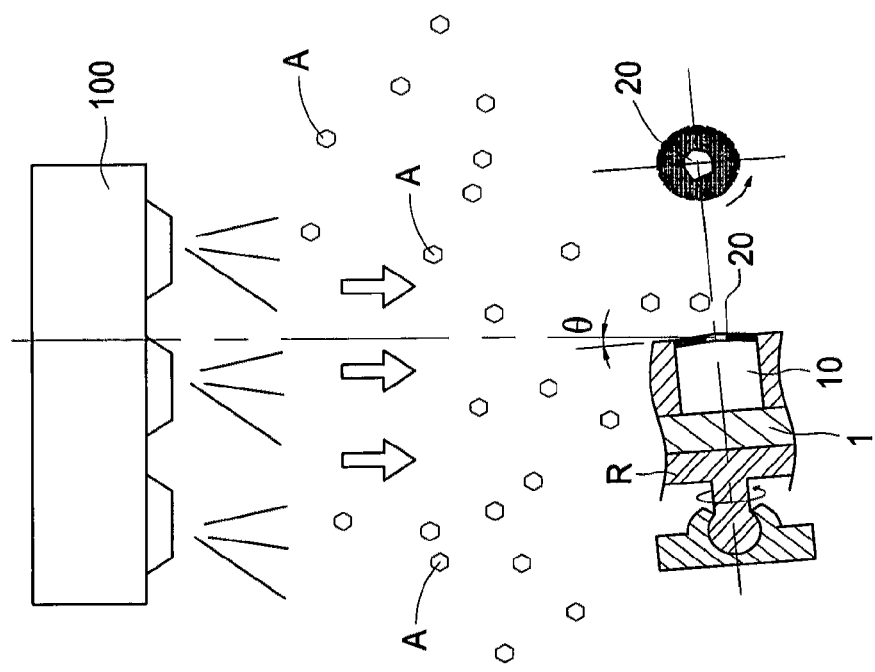
FIG. 6g is the seventh step in flow chart showing the implementing process of first reduced nano-aperture on the top of nano cylindrical pore for the present invention.
Figure 8:
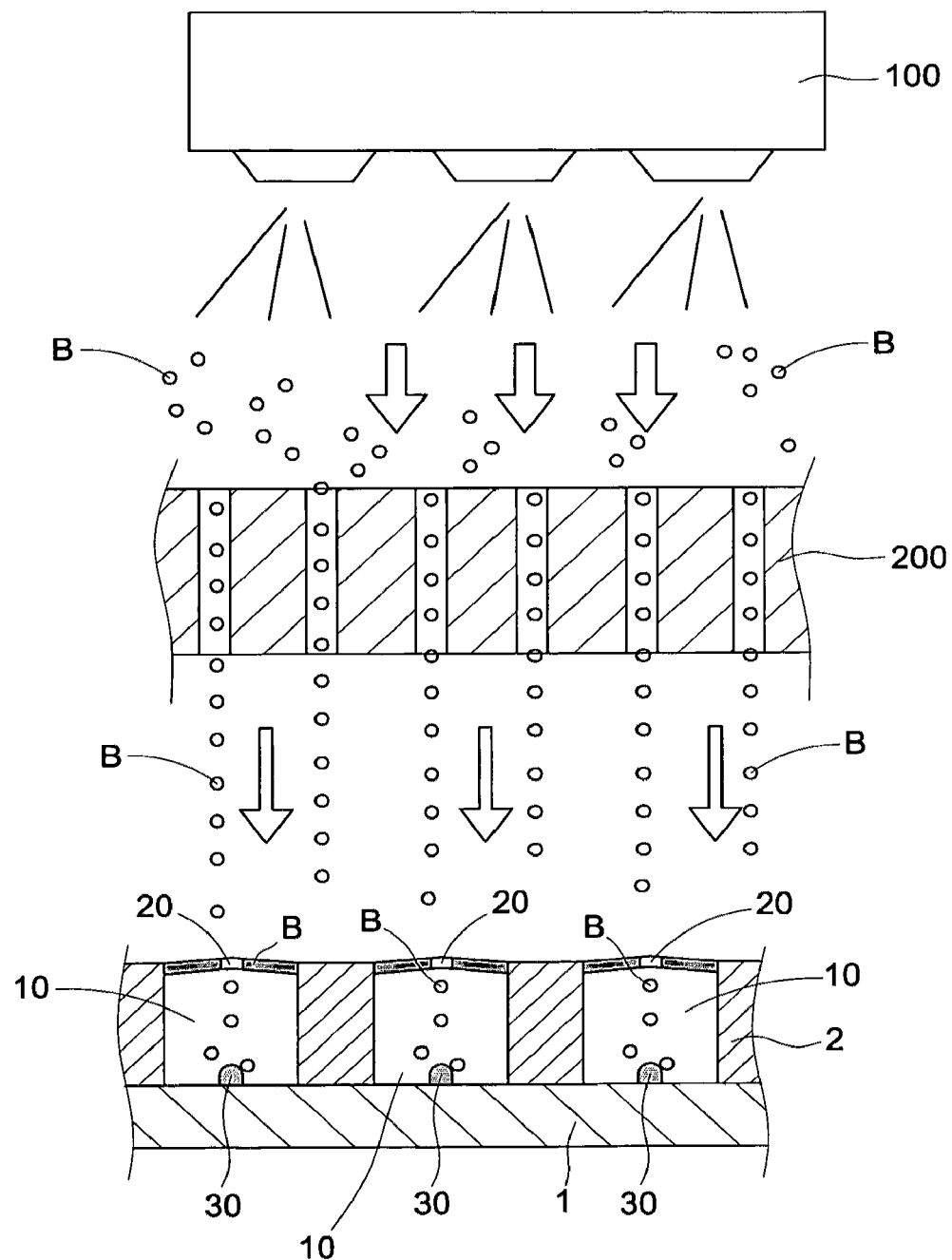
FIG. 8 is the operation schematic view showing the implementing process of core nano quantum dot in the bottom of nano cylindrical pore via first reduced nano-aperture for the present invention.
Figure 10:
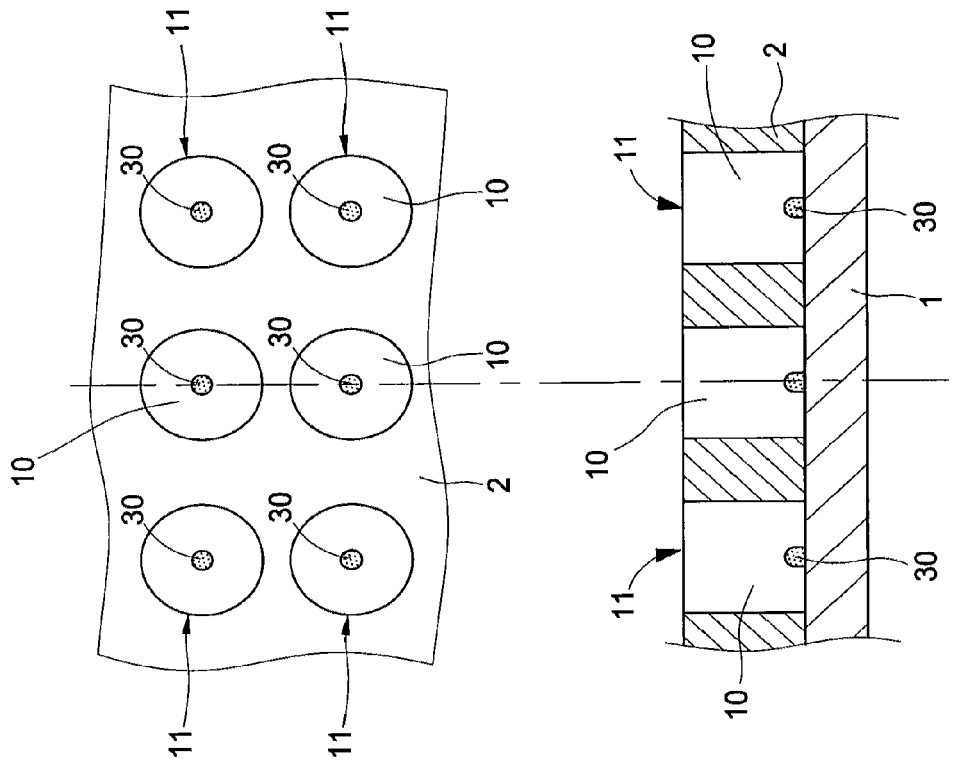
FIG. 10 is the schematic view showing the completion of nano quantum core on the surface of substrate with first reduced nano-aperture being removed for the FIG. 9.
Figure 9:
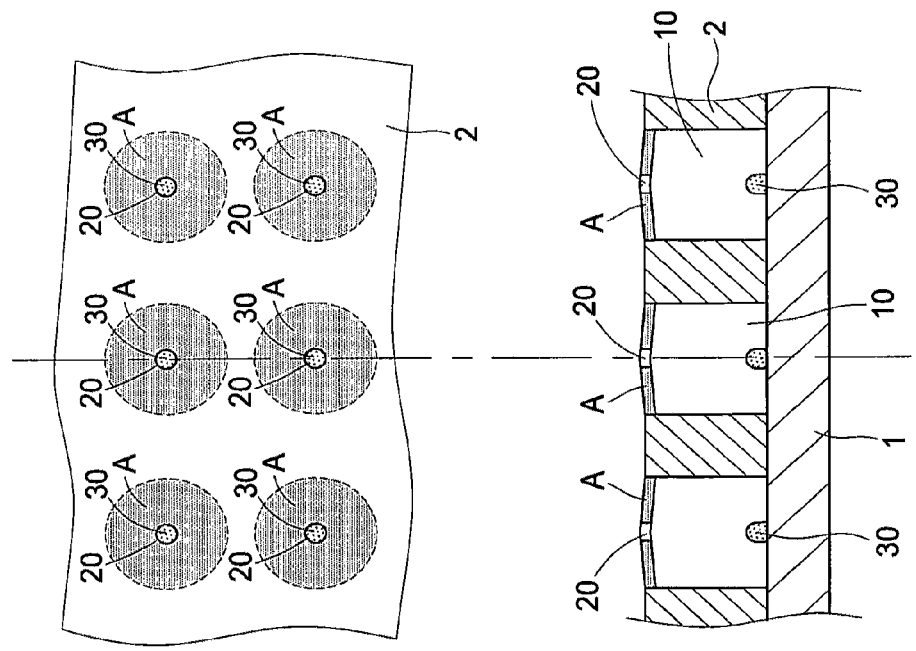
FIG. 9 is the schematic view showing the formation of core nano quantum dot on the surface of substrate via first reduced nano-aperture for the present invention.
Figure 11A:
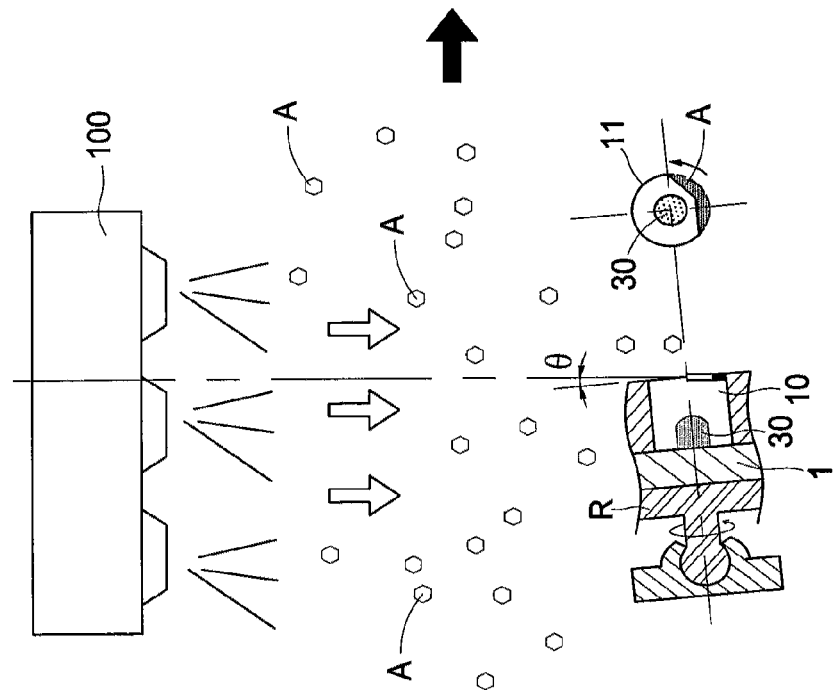
FIG. 11a is the first step in flow chart showing the implementing process of second reduced nano-aperture on the top of nano cylindrical pore for the present invention.
Figure 11B:
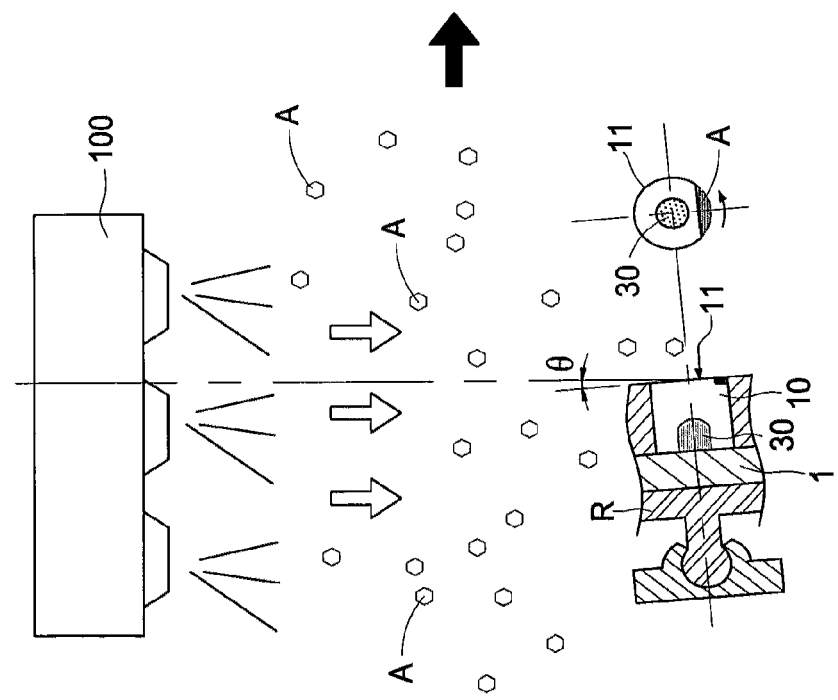
FIG. 11b is the second step in flow chart showing the implementing process of second reduced nano-aperture on the top of nano cylindrical pore for the present invention.
Figure 11F:
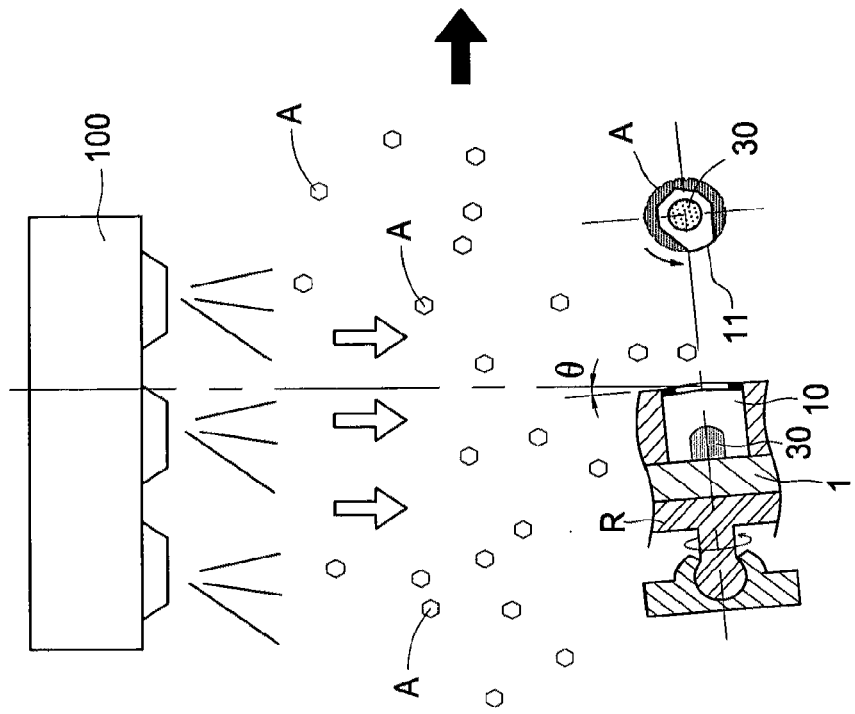
FIG. 11f is the sixth step in flow chart showing the implementing process of second reduced nano-aperture on the top of nano cylindrical pore for the present invention.
Figure 11E:
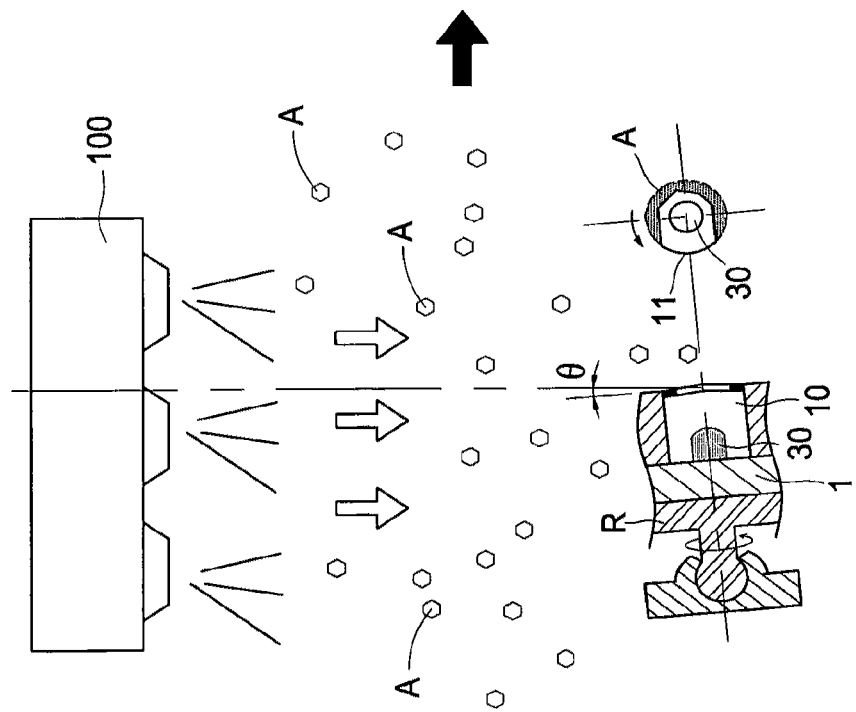
FIG. 11e is the fifth step in flow chart showing the implementing process of second reduced nano-aperture on the top of nano cylindrical pore for the present invention.
Figure 12:
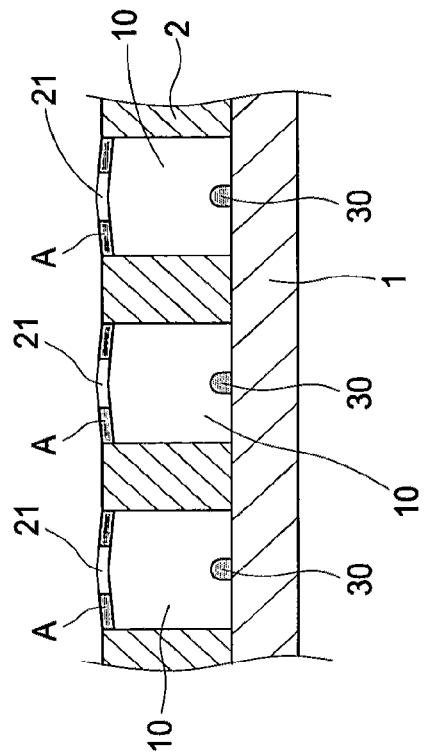
FIG. 12 is the cross section view showing the implementing completion of second reduced nano-aperture on the top of nano cylindrical pore for the present invention.
Figure 11G:
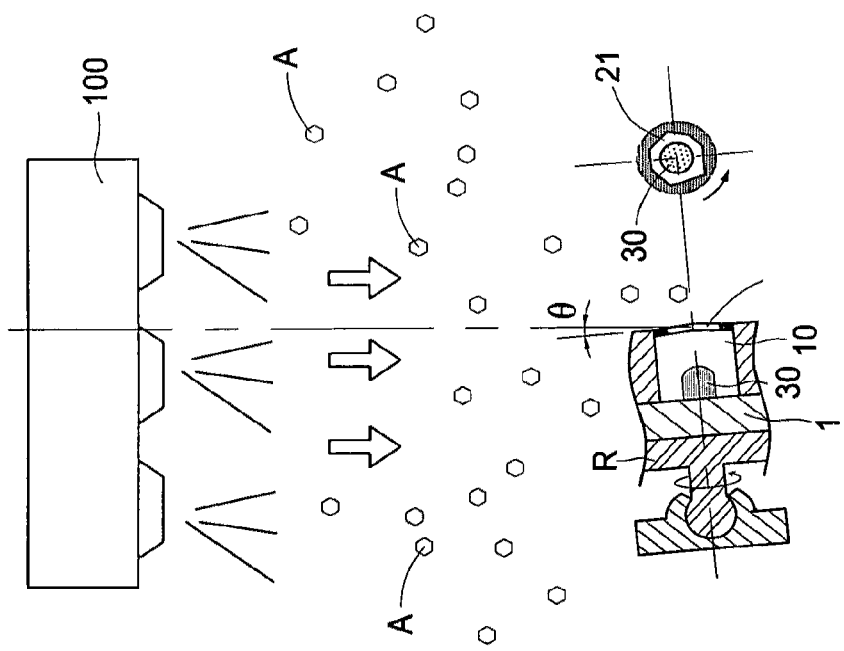
FIG. 11g is the seventh step in flow chart showing the implementing process of second reduced nano-aperture on the top of nano cylindrical pore for the present invention.
Figure 13:
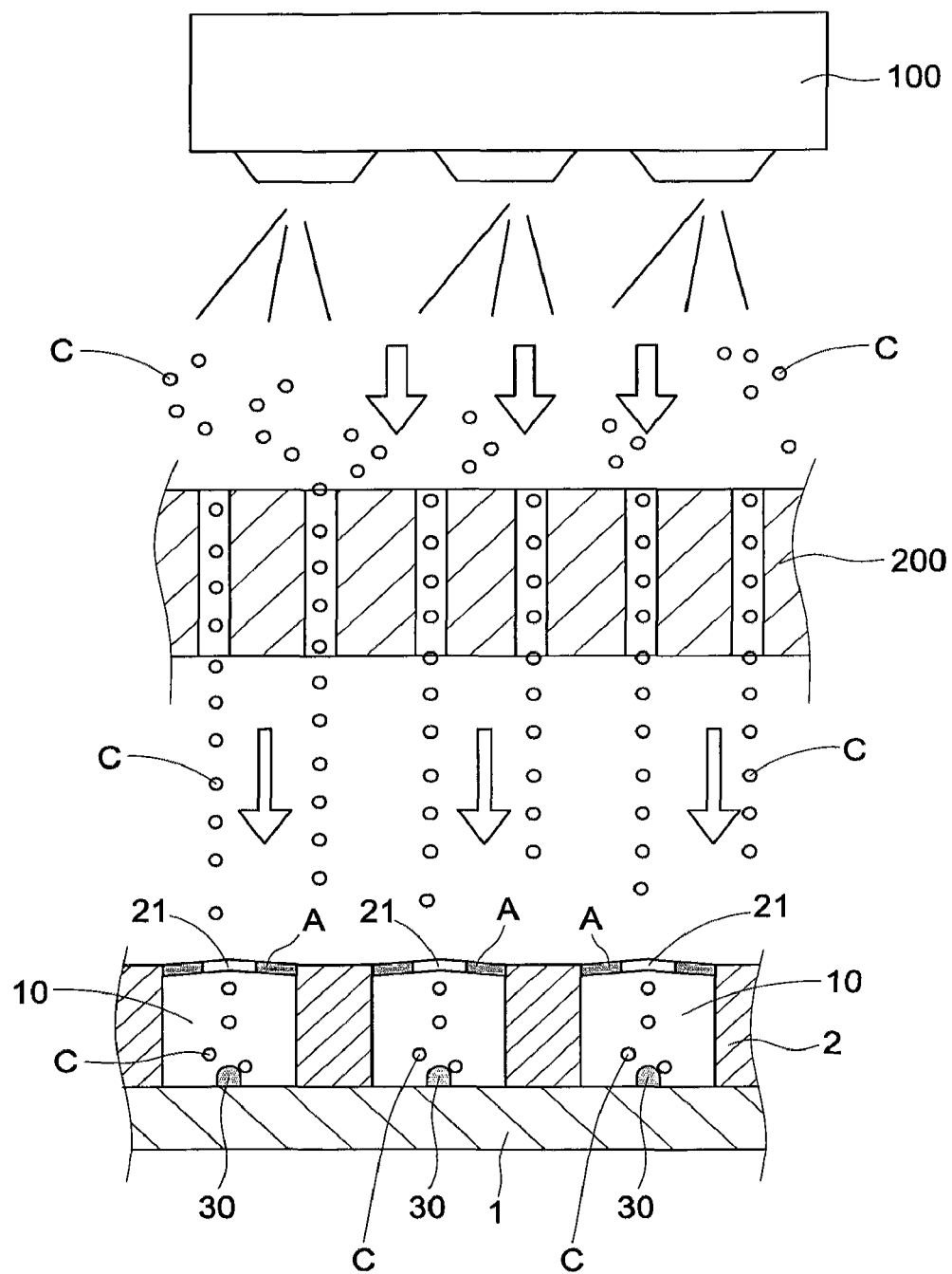
FIG. 13 is the first step in operation schematic view showing the implementing process of ambit nano quantum dot in the bottom of nano cylindrical pore via second reduced nano-aperture for the present invention.
Figure 14:
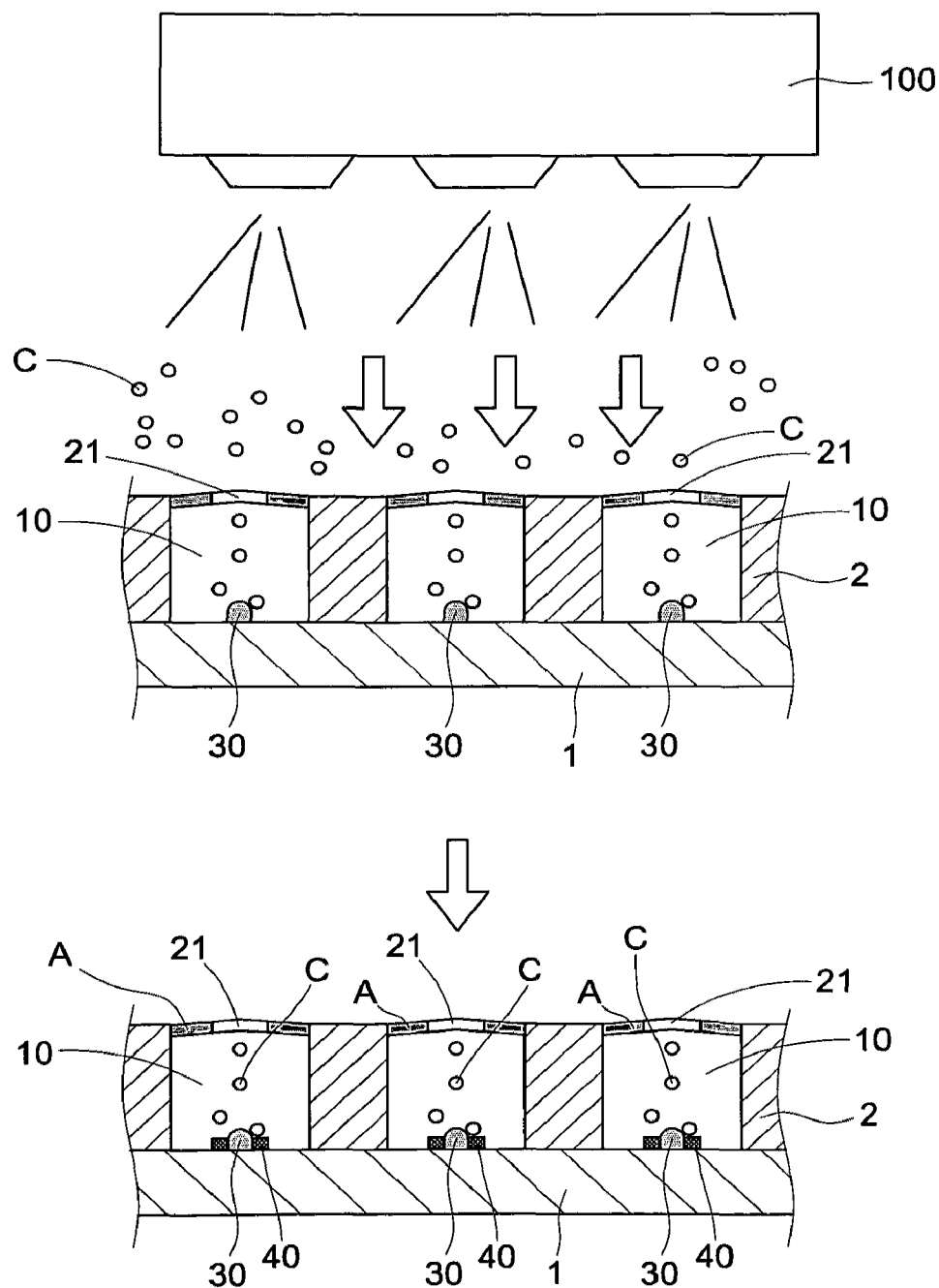
FIG. 14 is the second step in operation schematic view showing the implementing process of ambit nano quantum dot in the bottom of nano cylindrical pore via second reduced nano-aperture for the present invention.
Figure 20A:
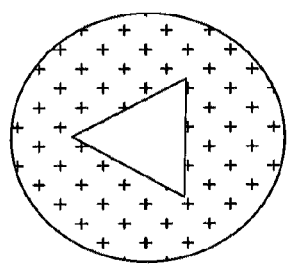
FIG. 20a is the schematic view showing the first combination of triangular first reduced nano-aperture and round second reduced nano-aperture on the top of nano cylindrical pore for the present invention.
Figure 20B:
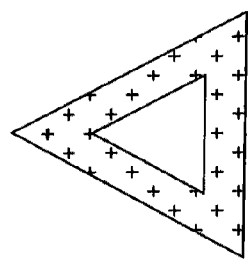
FIG. 20b is the schematic view showing the second combination of triangular first reduced nano-aperture and triangular second reduced nano-aperture on the top of nano cylindrical pore for the present invention.

Please refer to FIG. 4. The existing nano cylindrical pore 10 is fabricated from conventional process in accordance with the build-up or build-down method; The minimum size of said conventional nano cylindrical pore 10 is 60 nm or 60 nm over; The alternative to implement the fabricating process includes options of photolithography, nano-imprinting, MBE (Molecular Beam Epitaxy) and MOVCD (Metal-Organic Vapor phase Chemical Deposition in Epitaxy); However, the ways of these conventional technologies aforesaid will be not detailed described here as their feature and know-how being not aspired after by the present invention.

Please further refer to FIGS. 4 through 17. The process steps of "fabricating method of nano-ring structure by nano-lithography" in accordance with the present invention comprise:

(a): Firstly, deposit a sealant A, which is also known as sealing material colloquially, of gas molecule or atom state on top-opening 11 of a nano cylindrical pore 10, which having formed on a preset photo-resist 2 of substrate 1 (as shown in the FIG. 5) so that the diameter of said top-opening 11 gradually reduce to become a first reduced nano-aperture 20, whose opening diameter is smaller than that of said top-opening 11 (as shown in the FIGS. 6g and 7);

(b): Secondly, directly pass a first deposit material B of gas molecule or atom state through said first reduced nano-aperture 20 (as shown in the FIG. 8) so that a core nano quantum dot 30 of nano-ring structure with diameter being less than 60 nm is directly formed on the surface of said substrate 1, which being laid beneath the bottom of said nano cylindrical pore 10 (as shown in the FIGS. 8 and 9);

(c): Thirdly, remove the sealant A, which is deposited on the top opening of the first reduced nano-aperture 20 to recover the diameter of the top-opening 11 on said nano cylindrical pore 10 (as shown in the FIG. 10);

(d): Fourthly, re-deposit the sealant A of gas molecule or atom state on the top-opening 11 of the nano cylindrical pore 10 so that the diameter of said top-opening 11 gradually reduce to become a second reduced nano-aperture 21, whose opening diameter is smaller than that of said top-opening 11 but larger than that of the first reduced nano-aperture 20 (as shown in the FIGS. 11g and 12);

(e): Fifthly, directly pass a second deposit material C of gas molecule or atom state through said second reduced nano-aperture 21 (as shown in the FIG. 13) so that a ambit nano quantum dot 40 of nano-ring structure with diameter being less than 60 nm is directly formed on the surface of said substrate 1, which being laid beneath the bottom of said nano cylindrical pore 10 (as shown in the FIGS. 14 and 15);

(f): Sixthly, by means of solution rinsing (i.e. wet etching) or gas etching (i.e. dry etching), remove both of the nano cylindrical pore 10 and the photo-resist 2 on the substrate 1 (as shown in the FIG. 16); and (g): Finally, by means of etching method, selectively remove the first deposit material B in the range of core nano quantum dot 30 so that a nano-ring structure 50 is directly formed on the substrate 1 by existing second deposit material C between the outer circumference of the core nano quantum dot 30 and the inner circumference of the ambit nano quantum dot 40 (as shown in the FIG. 17 and associated top view).

Wherein, the implementing process of the aforesaid step (a) in forming said reduced nano-aperture 20 on said top-opening 11 of said nano cylindrical pore 10 is shown in the FIGS. 6a through 6g, which comprises sub-steps as below:

(1): Firstly, firmly place said substrate 1 on a tilt-rotary console R having capability of 3-D tilt with rotation and adjust said tilt-rotary console R in tilt angle θ (as shown in a view of the FIG. 6a, namely the included angle value of the central line of said top-opening 11 of said nano cylindrical pore 10 and the output direction of a deposit source device 100 is 90°−θ) so that a sealing material A of gas molecule or atom state can partially deposit on the end rim of said top-opening 11 of said nano cylindrical pore 10 (as shown in The FIG. 6a and associated lateral section view marked with A); and (2): Secondly, let said tilt-rotary console R keep in tilt angle θ inclination, and gradually rotate it one complete rotation (as respectively shown in the FIGS. 6b, 6c, 6d, 6e, 6f and each of associated lateral section view thereof marked with A respectively), thereby a first reduced nano-aperture 20 with diameter being smaller than that of said top-opening 11 is formed on said top-opening 11 of said nano cylindrical pore 10 by deposition of said sealant A of gas molecule or atom state (as shown in the FIG. 6g and associated lateral section view). Wherein, the rotational number of said tilt-rotary console R can be increased so as to get a smaller orifice diameter in said first reduced nano-aperture 20; Besides, the size of the orifice diameter in said first reduced nano-aperture 20 can be real-time monitored by membrane thickness meter, which is available in the current market, to serve as basis in control the rotational speed of said tilt-rotary console R; Thus, the expected first reduced nano-aperture 20 with desired diameter can be obtained in this way.

Moreover, the output of said first deposit material B of gas molecule or atom state in step (a) aforesaid is supplied by said deposit source device 100; In order to regulate said first deposit material B of gas molecule or atom state to pass through said reduced nano-aperture 20 in manner of straight line path, a collimator 200 can be installed between said deposit source device 100 and said first reduced nano-aperture 20 (as shown in the FIG. 8) so that the moving direction of said first deposit material B of gas molecule or atom state becomes more coherent; Thus, the reliability of core nano quantum dot 30 forming on the surface of said substrate 1 is enhanced.

Therefore, the outermost circumferential diameter of a nano-ring structure 50 fabricated by the aforesaid process steps (a) through (g) (as shown in the FIG. 17) is smaller than that of the top-opening 11 on said nano cylindrical pore 10; Consequently, the size in nano-scale of said nano-ring structure 50 formed on said substrate 1 is definitely smaller than that of said nano cylindrical pore 10. For example, let the nano-scale of nano cylindrical pore 10 is 60 nm, and the diameter of said second reduced nano-aperture 21 formed by having reduced on said top-opening 11 is 30 nm; Then, the final size in nano-scale of said nano-ring structure 50 formed on said substrate 1 is 30 nm.

Furthermore, as shown in the FIG. 18, the process steps (a) through (e) and step (g) aforesaid for the present invention can be reiterated for fabricating laminated nano ring structure 60 of multi-layers on the surface of substrate.

Figure 19B:
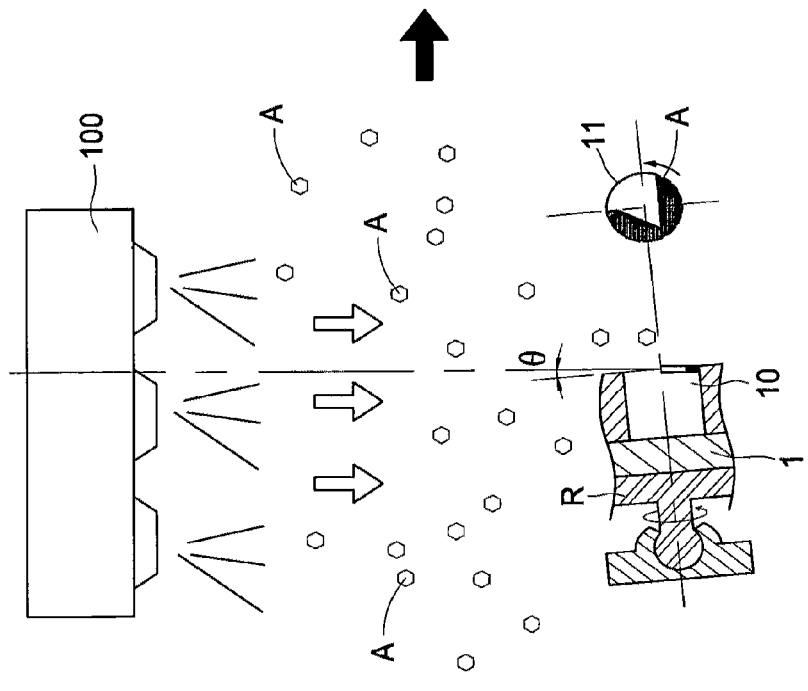
FIG. 19b is the second step in flow chart showing the implementing process of first reduced nano-aperture in different geometric shape on the top of nano cylindrical pore for the present invention.
Figure 19A:
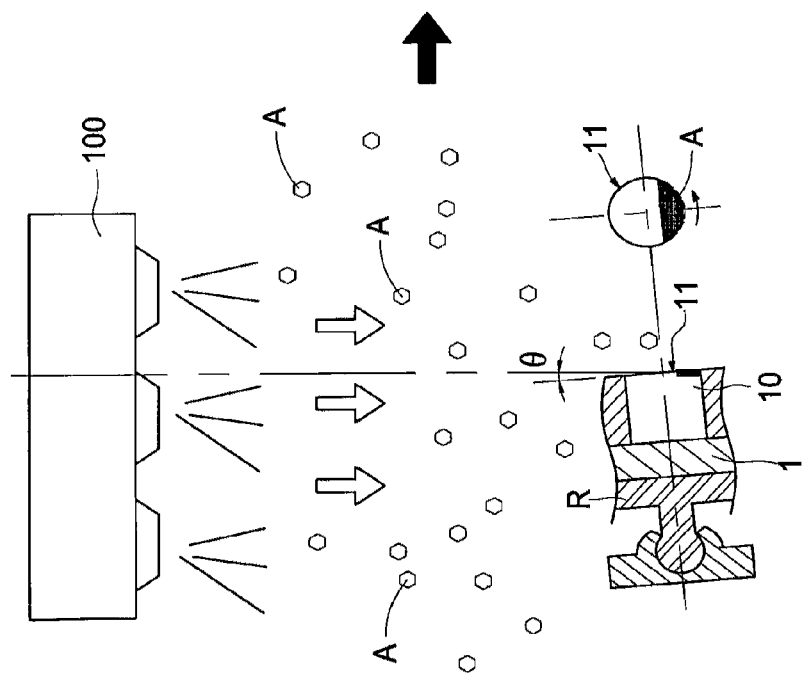
FIG. 19a is the first step in flow chart showing the implementing process of first reduced nano-aperture in different geometric shape on the top of nano cylindrical pore for the present invention.
Figure 19C:
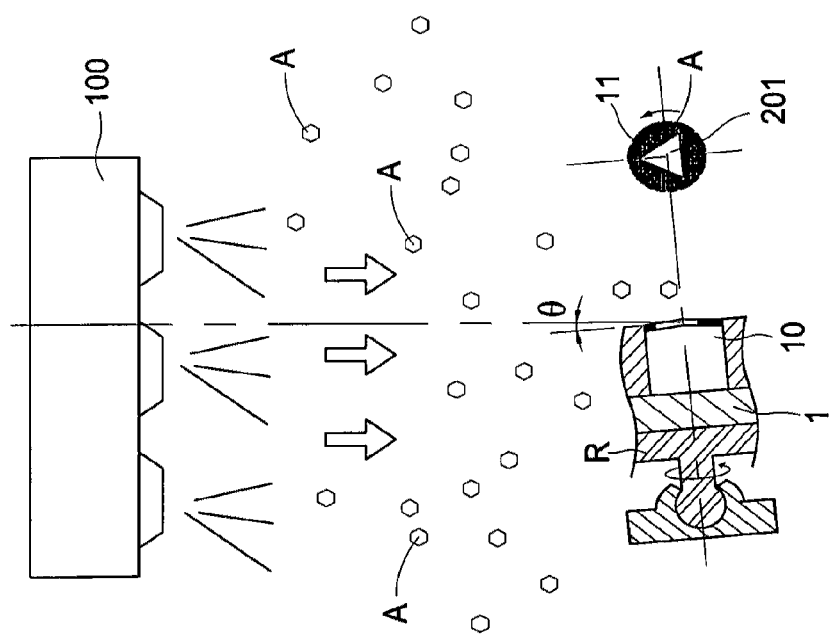
FIG. 19c is the third step in flow chart showing the implementing process of first reduced nano-aperture in different geometric shape on the top of nano cylindrical pore for the present invention.
Figure 21B:
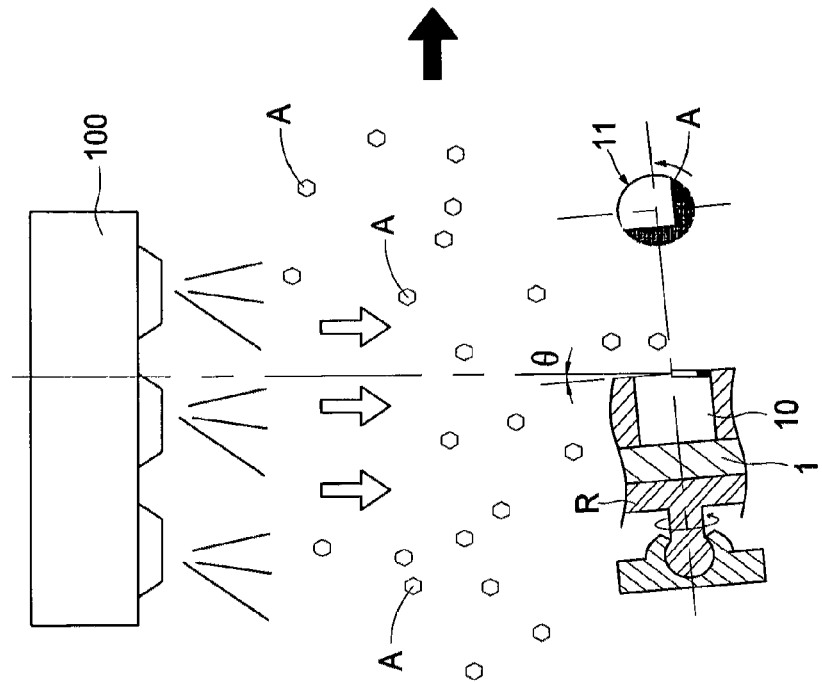
FIG. 21b is the second step in flow chart showing the implementing process of first reduced nano-aperture in another different geometric shape on the top of nano cylindrical pore for the present invention.
Figure 21A:
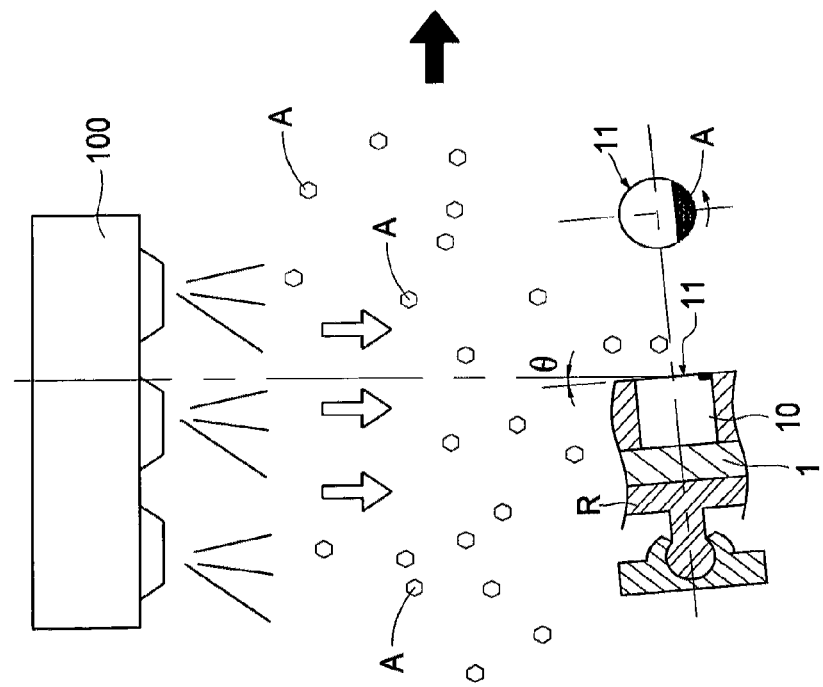
FIG. 21a is the first step in flow chart showing the implementing process of first reduced nano-aperture in another different geometric shape on the top of nano cylindrical pore for the present invention.
Figure 21C:
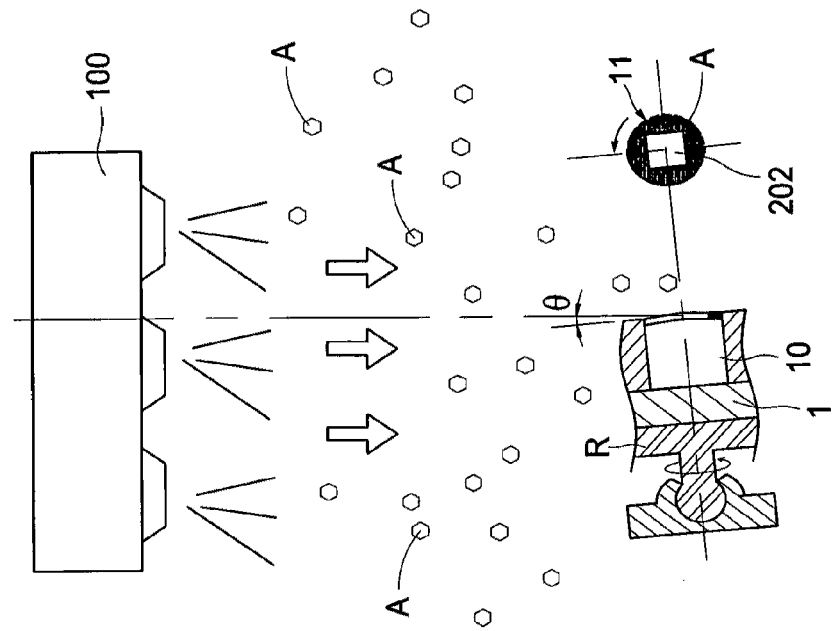
FIG. 21c is the third step in flow chart showing the implementing process of first reduced nano-aperture in another different geometric shape on the top of nano cylindrical pore for the present invention.
Figure 21D:
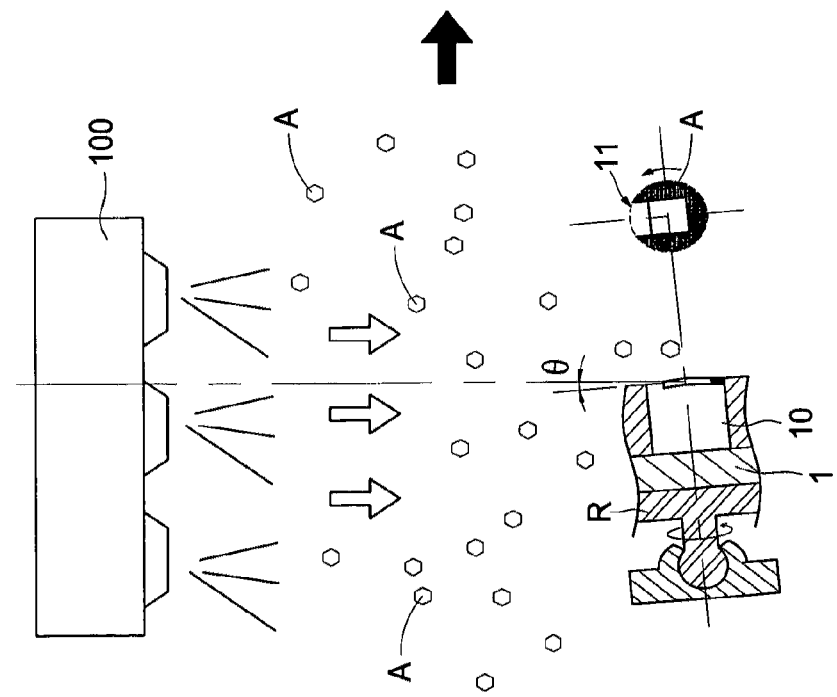
FIG. 21d is the fourth step in flow chart showing the implementing process of first reduced nano-aperture in another different geometric shape on the top of nano cylindrical pore for the present invention.
Figure 25:
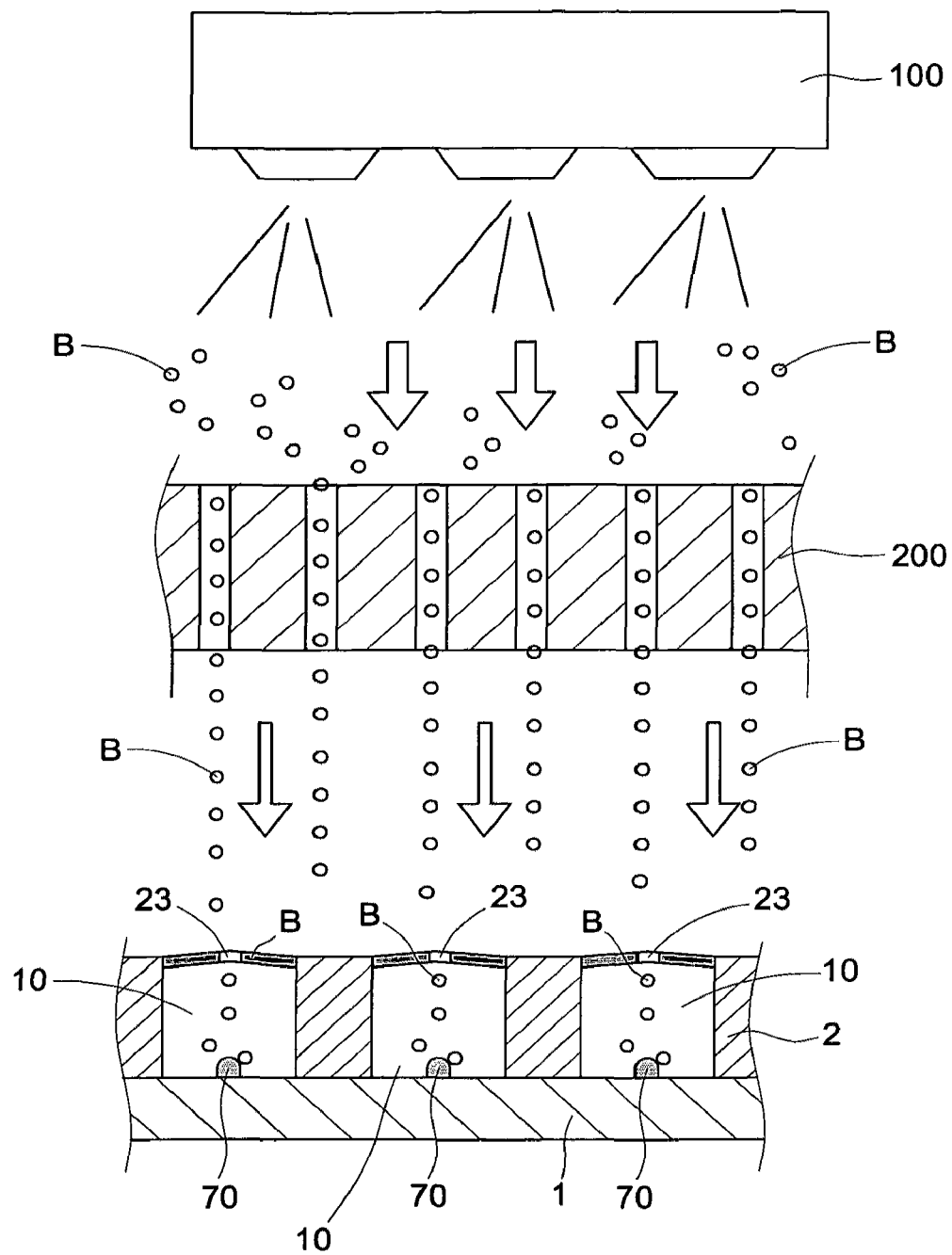
FIG. 25 is the operation schematic view showing the implementing process of core nano quantum dot in the bottom of nano cylindrical pore via reduced nano-aperture for the second exemplary embodiment of present invention.
Figure 26:
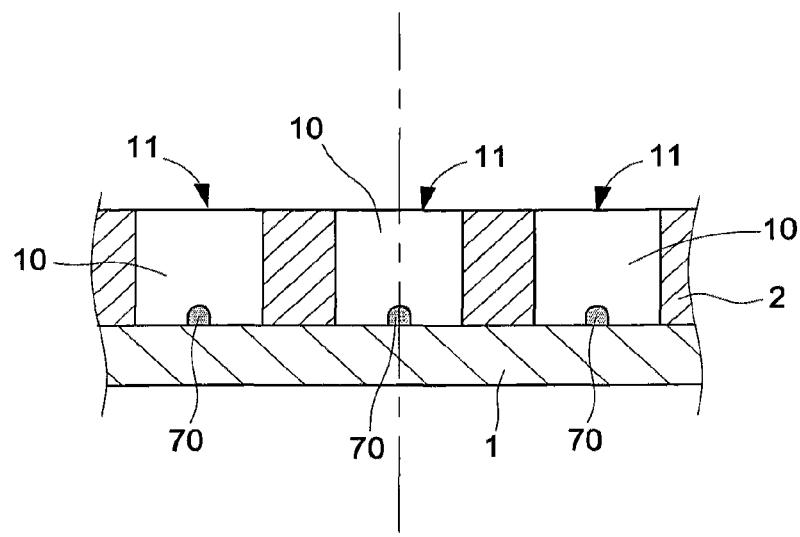
FIG. 26 is the cross section schematic view showing the implementing completion of nano quantum core in the bottom of nano cylindrical pore with reduced nano-aperture having been removed for the second exemplary embodiment of present invention.
Figure 27:
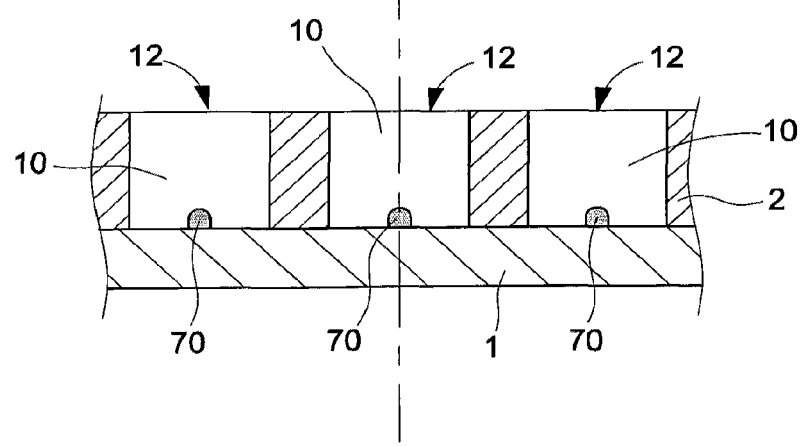
FIG. 27 is the cross section schematic view showing the expanding completion of nano cylindrical pore for the second exemplary embodiment of present invention.
Figure 28:
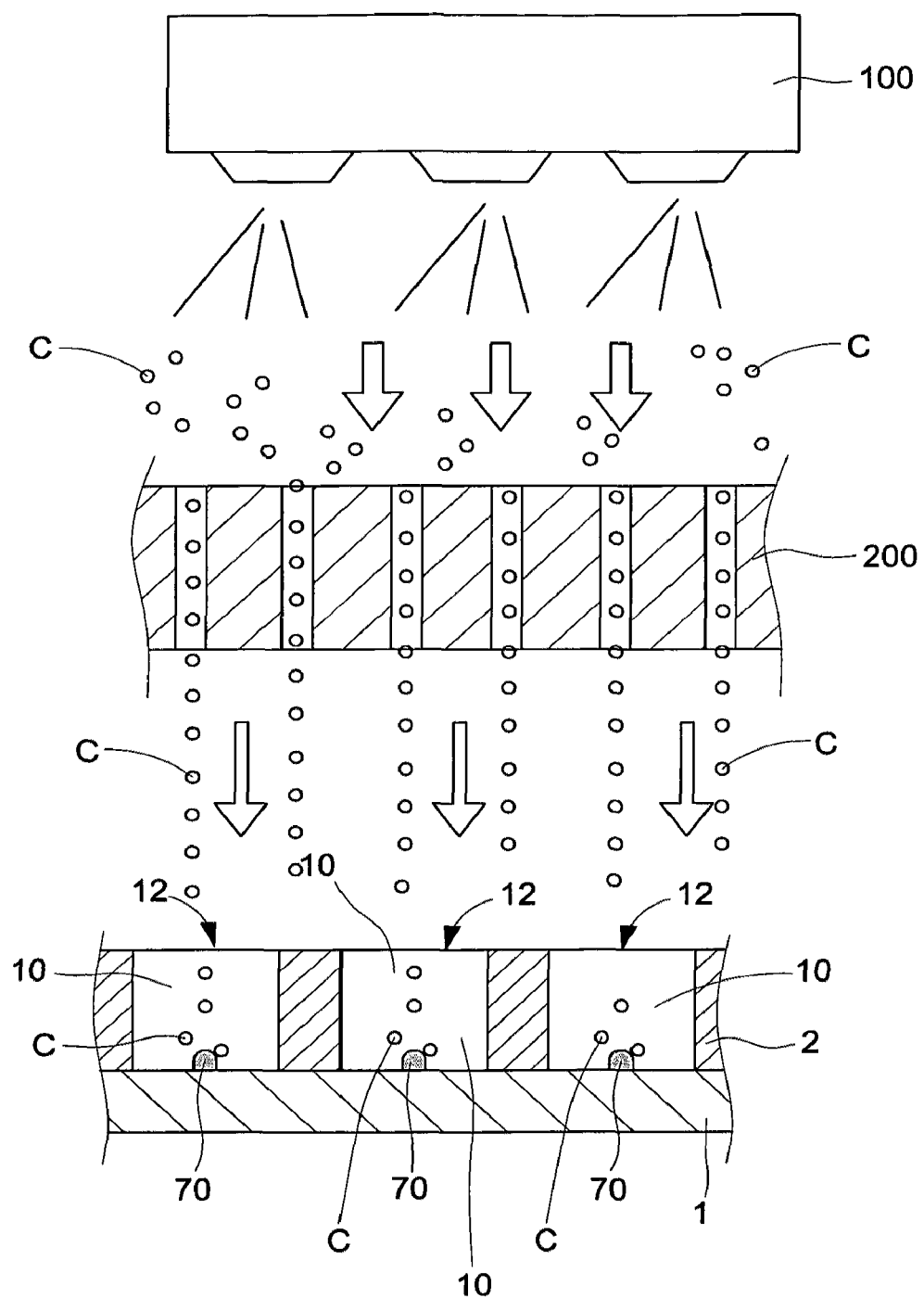
FIG. 28 is the operation schematic view showing the first step in the implementing process of ambit nano quantum dot in the bottom of expanded nano cylindrical pore for the second exemplary embodiment of present invention.
Figure 29:
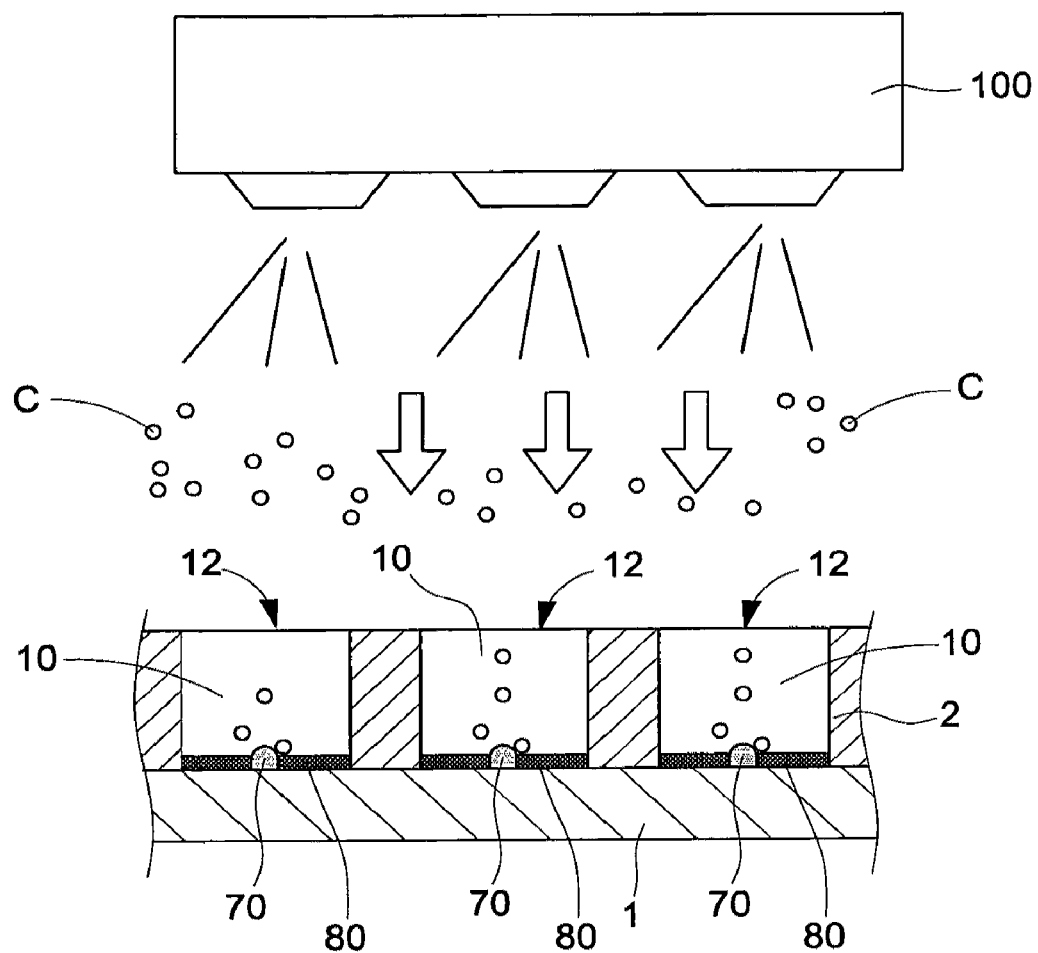
FIG. 29 is the operation schematic view showing the second step in the implementing process of ambit nano quantum dot in the bottom of expanded nano cylindrical pore for the second exemplary embodiment of present invention.
Figure 33A:
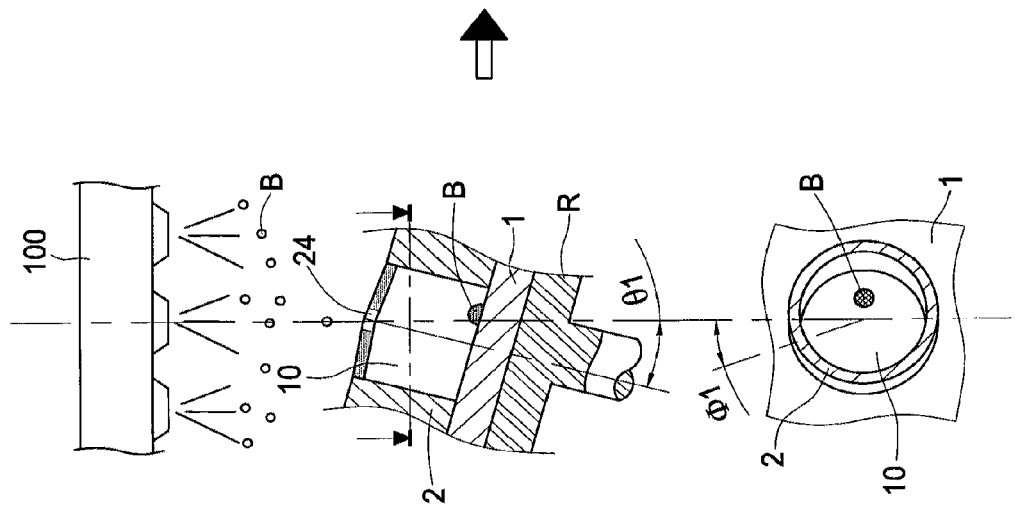
FIG. 33a is the first step in operation schematic view showing the implementing process of nano ring structure on the bottom surface of nano cylindrical pore via reduced nano-aperture for the third exemplary embodiment of present invention.

As further shown in the FIGS. 19a through 19c and 20a through 20c, the geometric shape for first reduced nano-aperture 20 of the present invention can be modified into triangular first reduced nano-aperture 201 by intermittently controlling the tilt-rotary console R (as shown in the FIG. 19c and the associated lateral section view); Similarly, the geometric shape for second reduced nano-aperture 21 can also be modified into different geometric shapes such as round or triangular shape; Thereby, by means of different combination of first reduced nano-aperture shape and second reduced nano-aperture shape, the various shape of nano-ring structure can be fabricated accordingly for the present invention (as shown in the FIGS. 20a and 20b). Likewise, as shown in the FIGS. 20 and 21, the geometric shape for first reduced nano-aperture 20 of the present invention can also be modified into square first reduced nano-aperture 202 by the same previous method (as shown in the FIG. 21*d*); Similarly, the geometric shape for second reduced nano-aperture 21 can also be modified into different geometric shapes such as round or triangular shape; Thereby, by means of different combination of first reduced nano-aperture shape and second reduced nano-aperture shape, the various shape of nano-ring structure 60 can be fabricated accordingly for the present invention (as shown in the FIGS. 22*a* and 22*b*). Thus, exemplary different nano-ring structures in combination of round first reduced nano-aperture with triangular or square second reduced nano-aperture can be fabricated (as shown in the FIGS. 23*a* and 23*b*).

Moreover, as shown in the FIGS. 24 through 30, the process steps for the second exemplary embodiment of the present invention comprise:

(a): Firstly, deposit a sealant A of gas molecule or atom state on top-opening 11 of a nano cylindrical pore 10, which having formed on a preset photo-resist 2 of substrate 1 so that the diameter of said top-opening 11 gradually reduce to become a first reduced nano-aperture 23, whose opening diameter is smaller than that of said top-opening 11 (as shown in the FIG. 24);

(b): Secondly, directly pass a first deposit material B of gas molecule or atom state through said first reduced nano-aperture 23 (as shown in the FIG. 8) so that a core nano quantum dot 70 of nano-ring structure with diameter being less than 40 nm is directly formed on the surface of said substrate 1, which being laid beneath the bottom of said nano cylindrical pore 10 (as shown in the FIG. 25);

(c): Thirdly, remove the sealant A, which is deposited on the top opening of the first reduced nano-aperture 23 to recover the diameter of the top-opening 11 on said nano cylindrical pore 10 (as shown in the FIG. 26);

(d): Fourthly, by means of etching method, expand the nano cylindrical pore 10 for the recovered top-opening 11 such that the diameter of the expanded nano cylindrical pore 12 becomes larger than that of the top-opening 11 on the original nano cylindrical pore 10 (as shown in the FIG. 27);

(e): Fifthly, perpendicularly pass a second deposit material C of gas molecule or atom state through said expanded nano cylindrical pore 12 so that a ambit nano quantum dot 80, which encloses the core nano quantum dot 70, having diameter being same as that of the expanded nano cylindrical pore 12 is directly formed on the surface of said substrate 1, which being laid beneath the bottom of said nano cylindrical pore 10 (as shown in the FIGS. 28 and 29);

(f): Sixthly, by means of solution rinsing (i.e. wet etching) or gas etching (i.e. dry etching), remove both of the expanded nano cylindrical pore 12 and the photo-resist 2 on the substrate 1 (as shown in the FIG. 30); and (g): Finally, by means of etching method, selectively remove the first deposit material B in the range of core nano quantum dot 70 so that a nano-ring structure 90 is directly formed on the substrate 1 by existing second deposit material C between the outer circumference of the core nano quantum dot 70 and the inner circumference of the ambit nano quantum dot 80 (as shown in the FIG. 31 and associated top view).

Wherein, the redundant description for the implementing process of the aforesaid step (a) in forming said reduced nano-aperture 23 on said top-opening 11 of said nano cylindrical pore 10 is eliminated because it is the same as that of the first exemplary embodiment. The second exemplary embodiment of the present invention is applicable to the case for more precision in nano pattern of photomask M as the size of the nano cylindrical pore 10 on the photoresist 2 of the substrate 1 is normally less than 40 nm; therefore, the expanded nano cylindrical pore 12 by etching method is adopted to implement the ambit nano quantum dot 80.

Figure 32:
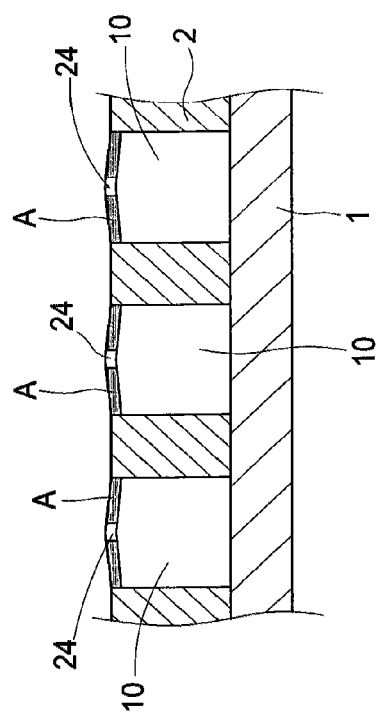
FIG. 32 is the cross section schematic view showing the implementing completion of reduced nano-aperture on the top of nano cylindrical pore for the third exemplary embodiment of present invention.
Figure 33E:
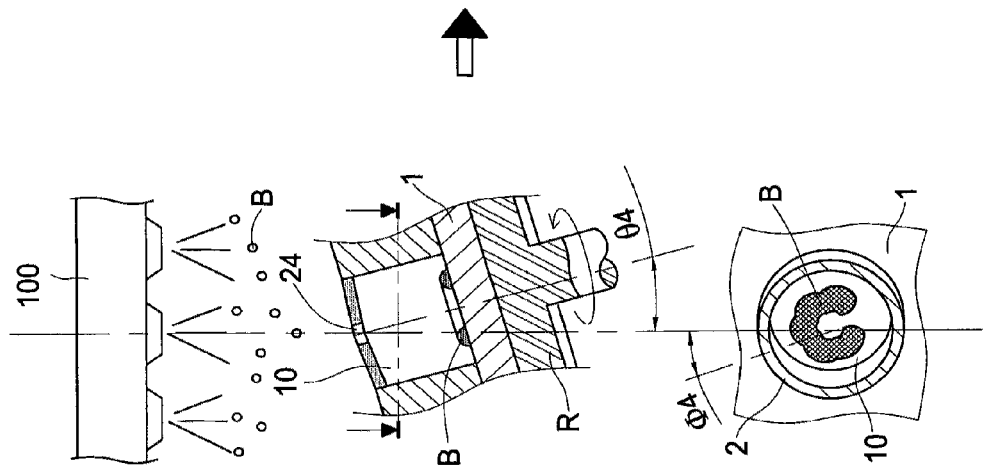
FIG. 33e is the fifth step in operation schematic view showing the implementing process of nano ring structure on the bottom surface of nano cylindrical pore via reduced nano-aperture for the third exemplary embodiment of present invention.
Figure 33D:
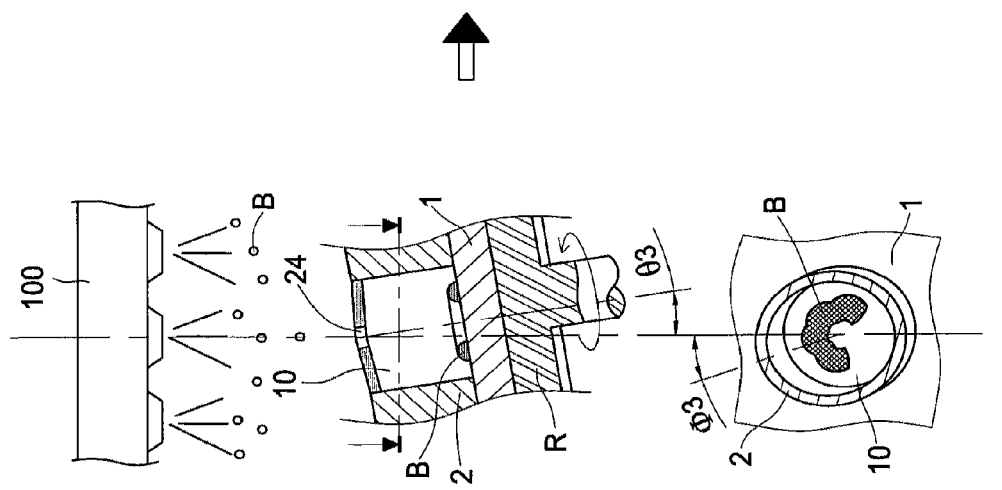
FIG. 33d is the fourth step in operation schematic view showing the implementing process of nano ring structure on the bottom surface of nano cylindrical pore via reduced nano-aperture for the third exemplary embodiment of present invention.
Figure 34:
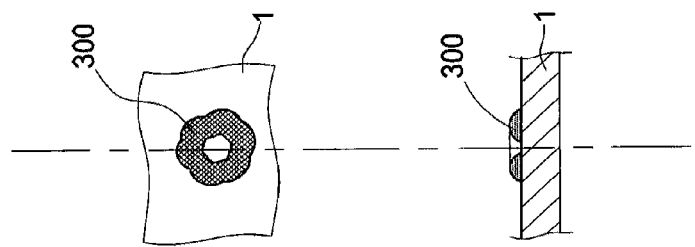
FIG. 34 is the cross section schematic view showing the forming completion of nano ring structure on the substrate for the third exemplary embodiment of present invention.
Figure 33F:
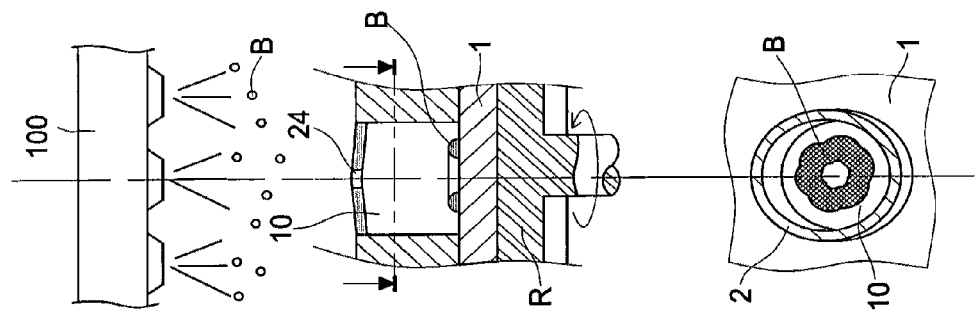
FIG. 33f is the sixth step in operation schematic view showing the implementing process of nano ring structure on the bottom surface of nano cylindrical pore via reduced nano-aperture for the third exemplary embodiment of present invention.

As shown in the FIGS. 32 through 34, the process steps for the third exemplary embodiment of the present invention comprise:

(a): Firstly, deposit a sealant A of gas molecule or atom state on top-opening 11 of a nano cylindrical pore 10, which having formed on a preset photo-resist 2 of substrate 1 so that the diameter of said top-opening 11 gradually reduce to become a reduced nano-aperture 24, whose opening diameter is smaller than that of said top-opening 11 (as shown in the FIG. 32); and (b): Secondly, firmly place said substrate 1 on a tilt-rotary console R having capability of 3-D tilt with rotation and one-by-one orderly adjust said tilt-rotary console R in rotation angles $\Phi1, \Phi2, \Phi3, \Phi4$ together with forwards and backwards tilt angles as well as leftwards and rightwards yaw angles $\theta1, \theta2, \theta3, \theta4$ (as shown in a view of the FIGS. 33*a* through 33*f* and each of associated top view thereof respectively) so that a deposit material B of gas molecule or atom state can orderly pass the reduced nano-aperture 24 to one-by-one continuously form a nano-ring structure 300 on the surface of the substrate 1 with diameter less than that of the nano cylindrical pore 10 (as shown in a view of the FIG. 34 and associated top view). Therefore, the nano-ring structure 300 is a nano bulged dot being formed by the deposition of said deposit material B of gas molecule or atom state on the surface of said substrate 1 through passing said reduced nano-aperture 24 by means of one-by-one orderly adjusting rotation angles $\Phi$ together with tilt and yaw angles $\theta$ such that its maximum outer diameter is definitely smaller than that of said nano cylindrical pore 10.

What is claimed is:

1. A method of fabricating a nano-ring structure by nano-lithography, comprising the steps of:

(a): first, depositing a sealant in a gaseous state on a top-opening of a nano cylindrical pore formed on a preset photo-resist on a substrate so that a diameter of said top-opening is gradually reduced to become a first reduced nano-aperture having an opening diameter that is smaller than the diameter of said top-opening;

(b): second, directly passing a first deposit material in a gaseous state through said first reduced nano-aperture so that a core nano quantum dot of the nano-ring structure is directly formed on a surface of said substrate, said core nano quantum dot being laid beneath the bottom of said nano cylindrical pore;

(c): third, removing the sealant, which is deposited on the top opening of the first reduced nano-aperture, to recover the diameter of the top-opening on said nano cylindrical pore;

(d): fourth, re-depositing the sealant on the top-opening of the nano cylindrical pore so that the diameter of said top-opening is gradually reduced to become a second reduced nano-aperture, whose opening diameter is smaller than that of said top-opening but larger than that of the first reduced nano-aperture;

(e): fifth, directly passing a second deposit material in a gaseous state through said second reduced nano-aperture so that an ambit nano quantum dot of the nano-ring structure is directly formed on the surface of said substrate, said ambit quantum dot being laid beneath the bottom of said nano cylindrical pore;

(f): sixth, by means of solution rinsing or gas etching, removing both of the nano cylindrical pore and the photo-resist on the substrate; and (g): finally, after removing the nano cylindrical pore and the photo-resist, by means of etching the first deposit material, selectively removing the first deposit material in an area of said core nano quantum dot so that a nano-ring structure is directly formed on the substrate by the second deposit material existing between an outer circumference of the core nano quantum dot and an inner circumference of the ambit nano quantum dot.

2. The fabricating method according to claim 1, wherein said opening diameter of said first reduced nano-aperture is less than 60 nm.

3. The fabricating method according to claim 1, wherein said opening diameter of said second reduced nano-aperture is less than 60 nm.

4. The fabricating method according to claim 1, wherein said implementing process of step (a) in forming said reduced nano-aperture on said top-opening of said nano cylindrical pore comprises sub-steps as below:
   (1): first, firmly placing said substrate on a tilt-rotary console having a capability of 3-D tilting with rotation and adjustment of a tilt-angle of the tilt-rotary console so that said sealant can be partially deposited on an end rim of said top-opening of said nano cylindrical pore; and
   (2): second, letting said tilt-rotary console maintain the tilt angle, and gradually rotating the tilt-rotary console one complete rotation, thereby forming first reduced nano-aperture with diameter smaller than that of said top-opening of said nano cylindrical pore by deposition of said sealant.

5. The process steps according to claim 4, wherein said rotational number of said tilt-rotary console in the sub-step (2) is increased so as to get a smaller orifice diameter in said first reduced nano-aperture.

6. The fabricating method according to claim 1, wherein a collimator is further installed between said deposit source device and the first reduced nano-aperture during step (a).

7. The fabricating method according to claim 1, wherein steps (a) through (e) and step (g) are reiterated for fabricating a laminated nano ring structure of multi-layers on the surface of substrate.

8. A method of fabricating a nano-ring structure by nano-lithography comprising the steps of:
   (a): first, depositing a sealant in a gaseous state on a top-opening of a nano cylindrical pore formed on a preset photo-resist on a substrate so that a diameter of said top-opening is gradually reduced to become a first reduced nano-aperture having an opening diameter that is smaller than the diameter of said top-opening;
   (b): second, directly passing a first deposit material in a gaseous state through said first reduced nano-aperture so that a core nano quantum dot of the nano-ring structure is directly formed on the surface of said substrate, said core nano quantum dot being laid beneath the bottom of said nano cylindrical pore;
   (c): third, removing the sealant, which is deposited on the top opening of the first reduced nano-aperture, to recover the diameter of the top-opening of said nano cylindrical pore;
   (d): fourth, by means of etching the nano cylindrical pore, expanding the nano cylindrical pore for the recovered top-opening such that a diameter of the expanded nano cylindrical pore becomes larger than that of the top-opening of the nano cylindrical pore;
   (e): fifth, perpendicularly passing a second deposit material in a gaseous state through said expanded nano cylindrical pore so that an ambit nano quantum dot, which encloses the core nano quantum dot and has a diameter that equals said diameter of the expanded nano cylindrical pore, is directly formed on the surface of said substrate, said ambit quantum dot being laid beneath the bottom of said nano cylindrical pore;
   (f): sixth, by means of solution rinsing or gas etching, removing both of the expanded nano cylindrical pore and the photo-resist on the substrate; and
   (g): finally, by means of etching the first deposit material, selectively removing the first deposit material in an area of the core nano quantum dot so that the nano-ring structure is directly formed on the substrate by the second deposit material existing between the outer circumference of the core nano quantum dot and the inner circumference of the ambit nano quantum dot.

9. The fabricating method accords with claim 8, wherein the diameter of said top-opening of the nano cylindrical pore has a diameter of less than 40 nm.

10. The fabricating method according to claim 8, wherein said first reduced nano-aperture has a diameter of less than 40 nm.

* * * * *